(12) United States Patent
Gronet

(10) Patent No.: US 7,196,262 B2
(45) Date of Patent: Mar. 27, 2007

(54) BIFACIAL ELONGATED SOLAR CELL DEVICES

(75) Inventor: Chris M Gronet, Portolla Valley, CA (US)

(73) Assignee: Solyndra, Inc., Santa Clara, CA (US)

( * ) Notice: Subject to any disclaimer, the term of this patent is extended or adjusted under 35 U.S.C. 154(b) by 0 days.

(21) Appl. No.: 11/158,178

(22) Filed: Jun. 20, 2005

(65) Prior Publication Data

US 2006/0283498 A1  Dec. 21, 2006

(51) Int. Cl.
*H01L 31/048* (2006.01)
*H01L 31/052* (2006.01)

(52) U.S. Cl. ............................. 136/246; 136/251
(58) Field of Classification Search ......... 136/243–265
See application file for complete search history.

(56) References Cited

U.S. PATENT DOCUMENTS

| | | | |
|---|---|---|---|
| 2,984,775 A | 5/1961 | Matlow et al. | |
| 3,005,862 A | 10/1961 | Escoffery | |
| 3,046,324 A | 7/1962 | Matlow | |
| 3,976,508 A | 8/1976 | Mlavsky | |
| 3,990,914 A | 11/1976 | Weinstein et al. | |
| 4,078,944 A | 3/1978 | Mlavsky | |
| 4,113,531 A | 9/1978 | Zanio et al. | |
| 4,217,148 A | 8/1980 | Carlson | |
| 4,292,092 A | 9/1981 | Hanak | |
| 4,497,974 A * | 2/1985 | Deckman et al. ........... | 136/259 |
| 4,686,323 A | 8/1987 | Biter et al. | |
| 4,783,373 A | 11/1988 | Baumeister et al. | |
| 4,913,744 A | 4/1990 | Hoegl et al. | |

(Continued)

FOREIGN PATENT DOCUMENTS

DE  32 09 548  3/1982

(Continued)

OTHER PUBLICATIONS

Website http://www.agr.gc.ca/pfra/water/solar_e.htm, "Solar Powered Water Pumping Systems for Livestock Watering" from Jul. 1, 2003, available from www.archive.org. 5 pages.*

(Continued)

*Primary Examiner*—Nam Nguyen
*Assistant Examiner*—Jeffrey Barton
(74) *Attorney, Agent, or Firm*—Jones Day; Brett Lovejoy

(57) ABSTRACT

A solar cell assembly comprising a plurality of elongated solar cells is provided. Each solar cell in the plurality of cells comprises a conductive core configured as a first electrode, a semiconductor junction circumferentially disposed on the conductive core, and a TCO layer disposed on the semiconductor junction. The plurality of solar cells is arranged in a parallel manner in pairs on a transparent insulating substrate such that (i) the solar cells in each respective pair are joined together lengthwise by a corresponding counter-electrode, and (ii) solar cells adjacent pairs of solar cells do not touch each other. Each solar cell pair is affixed to the transparent insulating substrate. A first and second solar cell pair is electrically connected in series by an electrical contact that electrically connects the first electrode of each cell in the first pair to the corresponding counter-electrode of the second pair.

34 Claims, 20 Drawing Sheets

U.S. PATENT DOCUMENTS

| | | | |
|---|---|---|---|
| 5,437,736 | A | 8/1995 | Cole |
| 5,902,416 | A | 5/1999 | Kern et al. |
| 6,018,123 | A * | 1/2000 | Takada et al. ............... 136/248 |
| 6,107,564 | A | 8/2000 | Aguilera et al. |
| 6,258,620 | B1 | 7/2001 | Morel et al. |
| 6,294,723 | B2 | 9/2001 | Uematsu et al. |
| 6,355,873 | B1 | 3/2002 | Ishikawa |
| 6,359,210 | B2 | 3/2002 | Ho et al. |
| 6,410,843 | B1 | 6/2002 | Kishi et al. |
| 6,541,695 | B1 * | 4/2003 | Mowles ...................... 136/252 |
| 6,548,751 | B2 | 4/2003 | Sverdrup, Jr. et al. |
| 6,555,739 | B2 | 4/2003 | Kawam |
| 6,706,959 | B2 | 3/2004 | Hamakawa et al. |
| 6,706,963 | B2 | 3/2004 | Gaudiana et al. |
| 6,762,359 | B2 | 7/2004 | Asai et al. |
| 6,806,414 | B2 | 10/2004 | Shiotsuka et al. |
| 6,940,008 | B2 | 9/2005 | Shiotsuka et al. |
| 2002/0130311 | A1 | 9/2002 | Lieber et al. |
| 2002/0180909 | A1 | 12/2002 | Lubart et al. |
| 2003/0121544 | A1 | 7/2003 | Hirata et al. |
| 2004/0063320 | A1 | 4/2004 | Hollars |
| 2005/0040374 | A1 | 2/2005 | Chittibabu et al. |
| 2005/0098202 | A1 | 5/2005 | Maltby, Jr. |
| 2006/0086384 | A1 | 4/2006 | Nakata |
| 2006/0185714 | A1 | 8/2006 | Nam et al. |

FOREIGN PATENT DOCUMENTS

| | | | |
|---|---|---|---|
| DE | 3801989 | * | 7/1989 |
| DE | 43 39 547 | | 11/1993 |
| DE | 43 43 514 | | 12/1993 |
| DE | 44 06 760 | | 3/1994 |
| DE | 197 32 876 | | 7/1997 |
| FR | 75 30980 | | 10/1975 |
| FR | WO 84/04425 | | 11/1984 |
| JP | S59-125670 | | 7/1984 |
| JP | S59-143377 | | 8/1984 |
| JP | S59-144177 | | 8/1984 |
| WO | WO 2005/034149 A2 | | 4/2004 |
| WO | WO 2004/061417 A2 | | 7/2004 |

OTHER PUBLICATIONS

Lambin et al., 1983, "Complete calculation of the electric potential produced by a pair of current source and sink energizing a circular finite-length cylinder," J. Appl. Phys. 54(7): 4174-4184.

Rabl, 1981, "Yearly Average Performance of the Principal Solar Collector Types," Solar Energy vol. 27. No. 3: 215-233.

Oria et al., 1985, "Improvement of the Albedo Collecting Effect By Varying The Rotation Axis in a Bifacial Polar Tracker," Proc. Melecon vol. IV: 125-128.

Sala et al., 1983, "Albedo Collecting Photovoltaic Bifacial Panels," 5th E.C. Photovoltaic Solar Energy Conference, Athens, Greece: 565-567.

Grillo et al., 1989, "Damage Control at the $SnO_2$/Si Interface in Optoelectronic Amorphous-Silicon Devices: An Auger and Electrical Study," IEEE Transactions on Electron Devices 36: 2829-2833.

Walker et al., Materials Issues in Amorphous-Semiconductor Technology, Materials Research Society Symposia Proceedings 70, Symposium held Apr. 15-18, 1986, Palo Alto California, pp. 563-568.

Birkmire et al., 2005, "Cu(InGa)$Se_2$ Solar Cells on a Flexible Polymer Web," Prog. Photovolt 13: 141-148.

Bube, 1998, "Photovoltaic Materials," Properties of Semiconductor Materials 1: 1-277.

Chaisitak et al., 2000, "Improvement in Performances of ZnO:B/i-ZnO/Cu(InGa)$Se_2$ Solar Cells by Surface Treatments for Cu(InGa)$Se_2$," The Japan Society of Applied Physics 39: 1660-1664.

Collares-Pereira et al., 1989, "Amorphous Silicon Photovoltaic Solar Cells—Inexpensive, High-Yield Optical Designs," ASME 111: 112-116.

Cuevas et al., 1982, "50 Per Cent More Output Power from an Albedo-collecting Flat Panel Using Bifacial Solar Cells," Solar Energy 29: 419-420.

Edmonds, 1990, "The Performance of Bifacial Solar Cells in Static Solar Concentrators," Solar Energy Materials 21: 173-190.

Jensen et al., 2003, "Back Contact Cracking During Fabrication of CIGS Solar Cells on Polyimide Substrates," NREL/CD, 877-881.

Joliet et al., 1985, "Laser-induced Synthesis of Thin $CuInSe_2$ Films," Appl. Phys. Lett. 46: 266-267.

Khosrofian et al., 1983, "Measurement of a Gaussian Laser Beam Diameter Through the Direct Inversion of Knife-edge Data," Applied Optics 22: 3406-3410.

Lugue, 1984, "Static Concentrators: A Venture to Meet the Low Cost Target in Photovoltaics," Solar Cells 12: 141-145.

Lugue, 1984-1985, "Diffusing Reflectors for Bifacial Photovoltaic Panels," Solar Cells 13: 277-292.

Lugue et al., 2003, "Handbook of Photovoltaic Science and Engineering," Wiley, 1-662.

Malbranche et al., 2000-2001, "The Three Ways To Exploit Solar Energy," CLEFS CEA No. 44: 25-37.

Otoma et al., 1991, "Growth of $CuGaS_2$ by Alternating-source-feeding MOVPE," Journal of Crystal Growth 115: 807-810.

Pandy et al., 1996, "Handbook of Semiconductor Electrodeposition," Applied Physics: 1-285.

Romeo, 2002, "Growth and Characterization of High Efficiency CdTe/CDS Solar Cells," Dissertation submitted to the Swiss Federal Institute of Technology Zurich: 1-103.

Sang et al., 2001, "Performance Improvement of CIGS-based Modules By Depositing High-quality Ga-doped ZnO Windows with Magnetron Sputtering," Solar Energy Materials & Solar Cells 67: 237-245.

Simpson et al., 2004, "Manufacturing Process Advancements for Flexible CIGS PV on Stainless Foil," Major FY Publications.

Stolt et al., 1994, "CIS Solar Cells with ZnO Windows Deposited by ALE," IEEE, 250-253.

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

"Tangram Technology Ltd.-Polymer Data File-PMMA" website, http:www.tangram.co.uk/TI-Polymer-PMMA.html from Jan. 12, 2002. Available from www.archive.org. 7 pages.

Trupke, T. et al., "Improving solar cell efficiencies by down-conversion of high-energy photons" J. Appl. Phys. 92, 1668-1674.

* cited by examiner

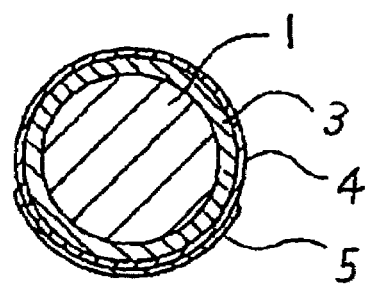
Fig. 3B
(Prior Art)
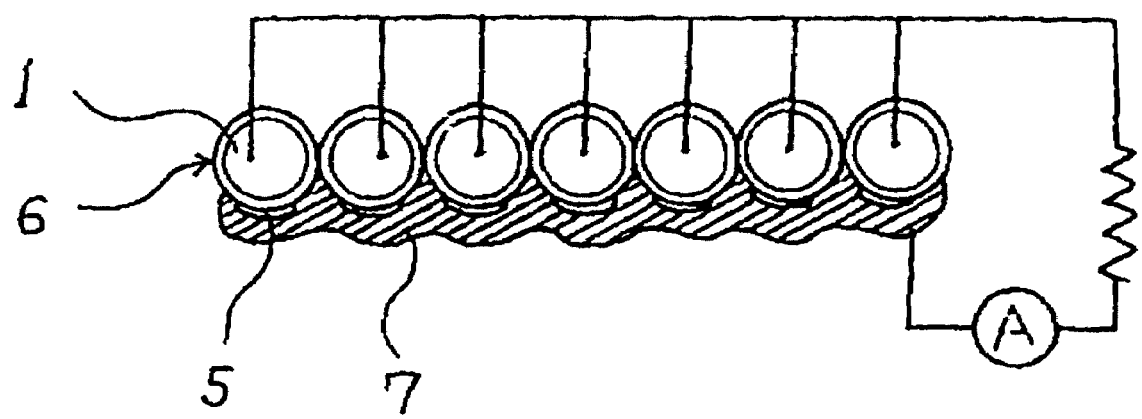
Fig. 3C
(Prior Art)

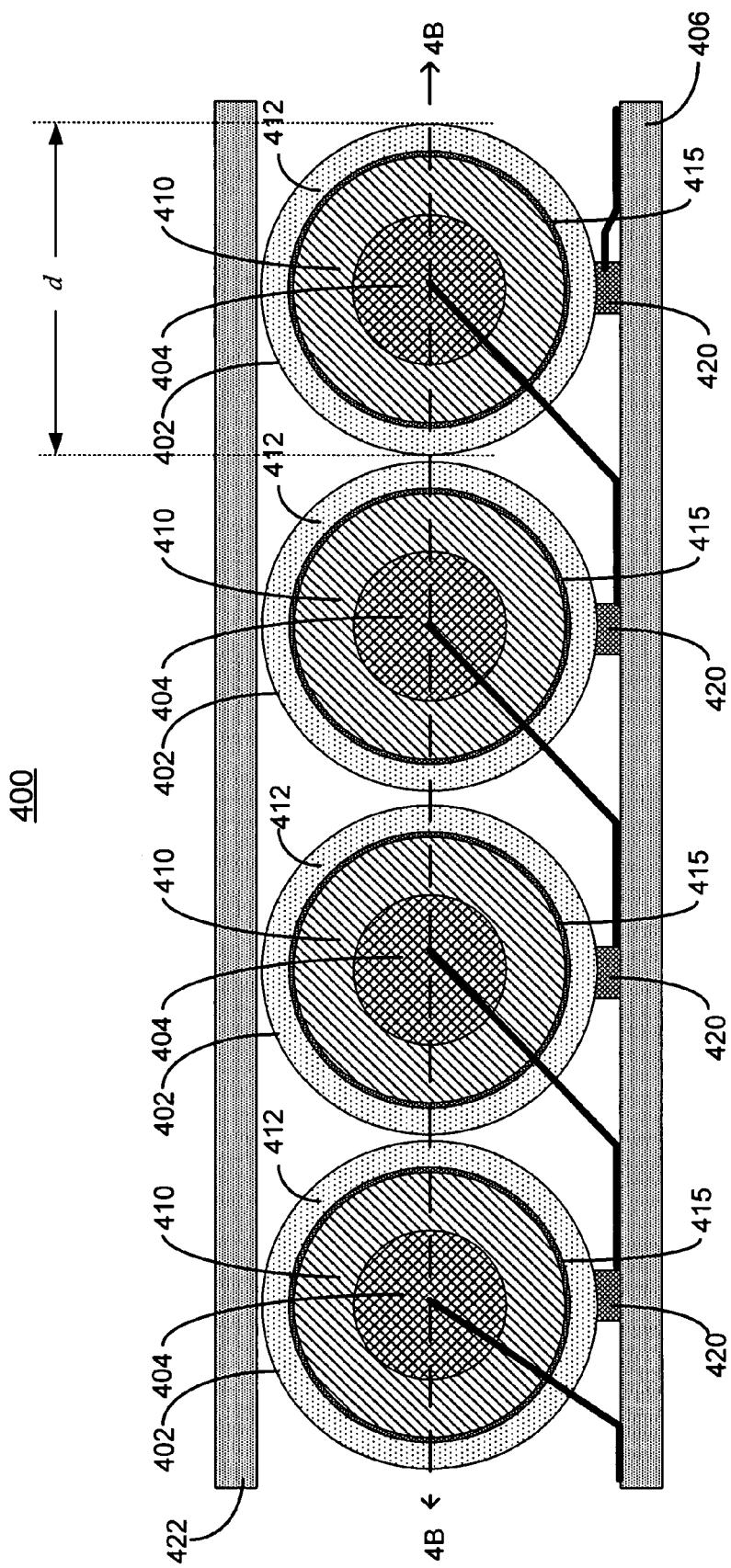

BIFACIAL ELONGATED SOLAR CELL DEVICES

1. FIELD OF THE INVENTION

This invention relates to solar cell assemblies for converting solar energy into electrical energy and more particularly to improved solar cell assemblies.

2. BACKGROUND OF THE INVENTION

Interest in photovoltaic cells has grown rapidly in the past few decades. Photovoltaic cells comprise semiconductor junctions such as p-n junctions. It is well known that light with photon energy greater than the band gap of an absorbing semiconductor layer in a semiconductor junction is absorbed by the layer. Such absorption causes optical excitation and the release of free electrons and free holes in the semiconductor. Because of the potential difference that exists at a semiconductor junction (e.g., a p-n junction), these released holes and electrons move across the junction in opposite directions and thereby give rise to flow of an electric current that is capable of delivering power to an external circuit. The flow of carriers into the external circuit constitutes a electrical current density, J amp $cm^{-2}$, which, under short-circuit conditions, is known as the short-circuit current density, $J_{sc}$. At the same time, the separation of the charges (holes and electrons) sets up a potential difference between the two ends of the material, $\phi$, which under open circuit conditions is known as the open-circuit voltage, $\phi_{OC}$. It is desirable to maximize both $J_{sc}$ and $\phi_{OC}$. For interaction with the solar spectrum, $J_{sc}$ and $\phi_{OC}$ are optimized when the junction semiconductor absorber has a band gap of about 1.4 electron volts (eV).

It is presently common practice to provide an array of solar cells to generate electrical energy from solar radiation. Many solar cells are made of silicon. However, cells made of other materials, e.g., cadmium sulfide and gallium arsenide, have also been developed and tested. Crystalline silicon has traditionally been a favored material since it has a band gap of approximately 1.1 eV and thus favorably responds to the electromagnetic energy of the solar spectrum. However, because of the expense in making crystalline silicon-based cells, thin film solar cells made of materials other than silicon have been explored and used.

Presently solar cells are fabricated as separate physical entities with light gathering surface areas on the order of 4–6 $cm^2$ or larger. For this reason, it is standard practice for power generating applications to mount the cells in a flat array on a supporting substrate or panel so that their light gathering surfaces provide an approximation of a single large light gathering surface. Also, since each cell itself generates only a small amount of power, the required voltage and/or current is realized by interconnecting the cells of the array in a series and/or parallel matrix.

A conventional prior art solar cell structure is shown in FIG. 1. Because of the large range in the thickness of the different layers, they are depicted schematically. Moreover, FIG. 1 is highly schematized so that it will represent the features of both "thick-film" solar cells and "thin-film" solar cells. In general, solar cells that use an indirect band gap material to absorb light are typically configured as "thick-film" solar cells because a thick film of the absorber layer is required to absorb a sufficient amount of light. Solar cells that use a direct band gap material to absorb light are typically configured as "thin-film" solar cells because only a thin layer of the direct band-gap material is need to absorb a sufficient amount of light.

The arrows at the top of FIG. 1 show the direction of the solar illumination on the cell. Layer (element) 102 is the substrate. Glass or metal is a common substrate. In thin-film solar cells, substrate 102 can be-a polymer-based backing, metal, or glass. In some instances, there is an encapsulation layer (not shown) coating substrate 102. Layer 104 is the back electrical contact for the solar cell. It makes ohmic contact with the absorber layer of semiconductor junction 106.

Layer 106 is the semiconductor absorber layer. In many but not all cases it is a p-type semiconductor. Absorber layer 106 is thick enough to absorb light. Layer 108 is the semiconductor junction partner-that completes the formation of a p-n junction, which is a common type of junction found in solar cells. In a solar cell based on a p-n junction, when absorber 106 is a p-type doped material, junction partner 108 is an n-type doped material. Conversely, when layer 106 is an n-type doped material, layer 108 is a p-type doped material. Generally, junction partner 108 is much thinner than absorber 106. For example, in some instances junction partner 108 has a thickness of about 0.05 microns. Junction partner 108 is highly transparent to solar radiation. Junction partner 108 is also known as the window layer, since it lets the light pass down to absorber layer 106.

In a typical thick-film solar cell, layers 106 and 108 can be made from the same semiconductor material but have different carrier types (dopants) and/or carrier concentrations in order to give the two layers their distinct p-type and n-type properties. In thin-film solar cells in which copper-indium-gallium-diselenide (CIGS) is absorber layer 106, the use of CdS to form layer 108 has resulted in high efficiency cells. Other materials that can be used for layer 108 include, but are not limited to, $SnO_2$, ZnO, $ZrO_2$ and doped ZnO.

Layer 110 is the top transparent electrode, which completes the functioning cell. Layer 110 is used to draw current away from the junction since junction partner 108 is generally too resistive to serve this function. As such, layer 110 should be highly conductive and transparent to light. Layer 110 can in fact be a comb-like structure of metal printed onto layer 108 rather than forming a discrete layer. Layer 110 is typically a transparent conductive oxide (TCO) such as zinc oxide (ZnO), indium-tin-oxide (ITO), or tin oxide ($SnO_2$). However, even when a TCO layer is present, a bus bar network 114 is typically needed to draw off current since the TCO has too much resistance to efficiently perform this function in larger solar cells. Network 114 shortens the distance charger carriers must move in the TCO layer in order to reach the metal contact, thereby reducing resistive losses. The metal bus bars, also termed grid lines, can be made of any reasonably conductive metal such as, for example, silver, steel or aluminum. In the design of network 114, there is design a tradeoff between thicker grid lines that are more electrically conductive but block more light, and thin grid lines that are less electrically conductive but block less light. The metal bars are preferably configured in a comb-like arrangement to permit light rays through TCO layer 110. Bus bar network layer 114 and TCO layer 110, combined, act as a single metallurgical unit, functionally interfacing with a first ohmic contact to form a current collection circuit. In U.S. Pat. No. 6,548,751 to Sverdrup et al., hereby incorporated by reference in its entirety, a combined silver (Ag) bus bar network and indium-tin-oxide layer function as a single, transparent ITO/Ag layer.

Layer 112 is an antireflection (AR) coating, which can allow a significant amount of extra light into the cell. Depending on the intended use of the cell, it might be deposited directly on the top conductor (as illustrated), or on a separate cover glass, or both. Ideally, the AR coating reduces the reflection of the cell to very near zero over the spectral region that photoelectric absorption occurs, and at the same time increases the reflection in the other spectral regions to reduce heating. U.S. Pat. No. 6,107,564 to Aguilera et al., hereby incorporated by reference in its entirety, describes representative antireflective coatings that are known in the art.

Solar cells typically produce only a small voltage. For example, silicon based solar cells produce a voltage of about 0.6 volts (V). Thus, solar cells are interconnected in series or parallel in order to get a reasonable voltage. When connected in series, voltages of individual cells add together while current remains the same. Thus, solar cells arranged in series reduce the amount of current flow through such cells, compared to analogous solar cells arrange in parallel, thereby improving efficiency. As illustrated in FIG. 1, the arrangement of solar cells in series is accomplished using interconnects 116. In general, an interconnect 116 places the first electrode of one solar cell in electrical communication with the counterelectrode of an adjoining solar cell.

As noted above and as illustrated in FIG. 1, conventional solar cells are typically in the form of a plate structure. Although such cells are highly efficient when they are smaller, larger planar solar cells have reduced efficiency because it is harder to make the semiconductor films that form the junction in such solar cells uniform. Furthermore, the occurrence of pinholes and similar flaws increase in larger planar solar cells. These features can cause shunts across the junction.

A number of problems are associated with solar cell designs present in the known art. A number of prior art solar cell designs and some of the disadvantages of each design will now be discussed.

As illustrated in FIG. 2, U.S. Pat. No. 6,762,359 B2 to Asia et al. discloses a solar cell 210 including a p-type layer 12 and an n-type layer 14. A first electrode 32 is provided on one side of the solar cell. Electrode 32 is in electrical contact with n-type layer 14 of solar cell 210. Second electrode 60 is on the opposing side of the solar cell. Electrode 60 is in electrical contact with the p-type layer of the solar cell. Light-transmitting layers 200 and 202 form one side of device 210 while layer 62 forms the other side. Electrodes 32 and 60 are separated by insulators 40 and 50. In some instances, the solar cell has a tubular shape rather than the spherical shape illustrated in FIG. 2. While device 210 is functional, it is unsatisfactory. Electrode 60 has to pierce absorber 12 in order to make an electrical contact. This results in a net loss in absorber area, making the solar cell less efficient. Furthermore, such a junction is difficult to make relative to other solar cell designs.

As illustrated in FIG. 3A, U.S. Pat. No. 3,976,508 to Mlavsky discloses a tubular solar cell comprising a cylindrical silicon tube 2 of n-type conductivity that has been subjected to diffusion of boron into its outer surface to form an outer p-conductivity type region 4 and thus a p-n junction 6. The inner surface of the cylindrical tube is provided with a first electrode in the form of an adherent metal conductive film 8 that forms an ohmic contact with the tube. Film 8 covers the entire inner surface of the tube and consists of a selected metal or metal alloy having relatively high conductivity, e.g., gold, nickel, aluminum, copper or the like, as disclosed in U.S. Pat. Nos. 2,984,775, 3,046,324 and 3,005,862. The outer surface is provided with a second electrode in the form of a grid consisting of a plurality of circumferentially extending conductors 10 that are connected together by one or more longitudinally-extending conductors 12. The opposite ends of the outer surface of the hollow tube are provided with two circumferentially-extending terminal conductors 14 and 16 that intercept the longitudinally-extending conductors 12. The spacing of the circumferentially-extending conductors 10 and the longitudinally-extending conductors 12 is such as to leave areas 18 of the outer surface of the tube exposed to solar radiation. Conductors 12, 14 and 16 are made wider than the circumferentially-extending conductors 10 since they carry a greater current than any of the latter. These conductors are made of an adherent metal film like the inner electrode 8 and form ohmic contacts with the outer surface of the tube. While the solar cell disclosed in FIG. 3 is functional, it is also unsatisfactory. Conductors 12, 14, and 16 are not transparent to light and therefore the amount of light that the solar cell receives is proportionally reduced by the amount of surface area occupied by the cells.

U.S. Pat. No. 3,990,914 to Weinstein and Lee discloses another form of tubular solar cell. Like Mlavsky, the Weinsten and Lee solar cell has a hollow core. However, unlike Mlavsky, Weinstein and Lee dispose the solar cell on a glass tubular support member. The Weinstein and Lee solar cell has the drawback of being bulky and expensive to build.

Referring to FIGS. 3B and 3C, Japanese Patent Application Kokai Publication Number S59-125670, Toppan Printing Company, published Jul. 20, 1984 (hereinafter "S59-125670") discloses a rod-shaped solar cell. The rod shaped solar cell is depicted in cross-section in FIG. 3B. A conducting metal is used as the core 1 of the cell. A light-activated amorphous silicon semiconductor layer 3 is provided on core 1. An electrically conductive transparent conductive layer 4 is built up on top of semiconductor layer 3. The transparent conductive layer 4 can be made of materials such as indium oxide, tin oxide or indium tin oxide (ITO) and the like. As illustrated in FIG. 3B, a layer 5, made of a good electrical conductor, is provided on the lower portion of the solar cell. The publication states that this good conductive layer 5 is not particularly necessary but helps to lower the contact resistance between the rod and a conductive substrate 7 that serves as a counter electrode. As such, conductive layer 5 serves as a current collector that supplements the conductivity of counter electrode 7 illustrated in FIG. 3C.

As illustrated in FIG. 3C, rod-shaped solar cells 6 are multiply arranged in a row parallel with each other, and counter electrode layer 7 is provided on the surface of the rods that is not irradiated by light so as to electrically make contact with each transparent conductive layer 4. The rod-shaped solar cells 6 are arranged in parallel and both ends of the solar cells are hardened with resin or a similar material in order to fix the rods in place.

S59-125670 addresses many of the drawbacks associated with planar solar cells. However, S59-125670 has a number of significant drawbacks that limit the efficiency of the disclosed devices. First, the manner in which current is drawn off the exterior surface is inefficient because layer 5 does not wrap all the way around the rod (e.g., see FIG. 3B). Second, substrate 7 is a metal plate that does not permit the passage of light. Thus, a full side of each rod is not exposed to light and can thus serve as a leakage path. Such a leakage path reduces the efficiency of the solar cell. For example, any such dark junction areas will result in a leakage that will detract from the photocurrent of the cell. Another disadvantage with the design disclosed in FIGS. 3B and 3C is that the rods are arranged in parallel rather than in series. Thus, the current levels in such devices will be large, relative to a corresponding serially arranged model, and therefore subject to resistive losses.

Referring to FIG. 3D, German Unexamined Patent Application DE 43 39 547 A1 to Twin Solar-Technik Entwicklungs-GmbH, published May 24, 1995, (hereinafter "Twin Solar") also discloses a plurality of rod-shaped solar cells 2 arranged in a parallel manner inside a transparent sheet 28, which forms the body of the solar cell. Thus, Twin Solar does not have some of the drawbacks found in S59-125670. Transparent sheet 28 allows light in from both faces 47A and 47B. Transparent sheet 28 is installed at a distance from a wall 27 in such a manner as to provide an air gap 26 through which liquid coolant can flow. Thus, Twin Solar devices have the drawback that they are not truly bifacial. In other words, only face 47A of the Twin Solar device is capable of receiving direct light. As defined here, "direct light" is light that has not passed through any media other than air. For example, light that has passed through a transparent substrate, into a solar cell assembly, and exited the assembly is no longer direct light once it exits the solar cell assembly. Light that has merely reflected off of a surface, however, is direct light provided that it has not passed through a solar cell assembly. Under this definition of direct light, face 47B is not configured to receive direct light. This is because all light received by face 47B must first traverse the body of the solar cell apparatus after entering the solar cell apparatus through face 47A. Such light must then traverse cooling chamber 26, reflect off back wall 42, and finally re-enter the solar cell through face 47B. The solar cell assembly is therefore inefficient because direct light cannot enter both sides of the assembly.

Discussion or citation of a reference herein will not be construed as an admission that such reference is prior art to the present invention.

3. SUMMARY OF THE INVENTION

One aspect of the present invention provides a solar cell assembly comprising a plurality of elongated solar cells. Each elongated solar cell in the plurality of elongated solar cells comprises (i) a conductive core configured as a first electrode, (ii) a semiconductor junction circumferentially disposed on the conductive core, and (iii) a transparent conductive oxide layer disposed on the semiconductor junction. Elongated solar cells in said plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly further comprises a plurality of electrode strips. Each respective electrode strip in the plurality of electrode strips is lengthwise disposed on a first side of a corresponding elongated solar cell in the plurality of elongated solar cells. The first side of the solar cell is part of the first face of the planar array. The solar cell assembly further comprises a transparent electrically insulating substrate that covers all or a portion of the first face of the planar array. A first and second elongated solar cell in the plurality of elongated solar cells are electrically connected in series by an electrical contact that connects the first electrode of the first elongated solar cell to the corresponding electrode strip of the second elongated solar cell. The plurality of elongated solar cells is configured to receive direct light from the first face and the second face of the planar array.

Another aspect of the invention is also directed to a solar cell assembly. The solar cell assembly comprises a plurality of elongated solar cells. Each elongated solar cell in the plurality of elongated solar cells comprises (i) a conductive core configured as a first electrode, (ii) a semiconductor junction circumferentially disposed on the conductive core, (iii) and a transparent conductive oxide layer disposed on the semiconductor junction. The elongated solar cells in the plurality of elongated solar cells are geometrically arranged in a parallel or near parallel manner as a plurality of solar cell pairs so as to form a planar array having a first face and a second face. The solar cells in a pair of solar cells do not touch the solar cells in an adjacent pair of solar cells in the planar array. The solar cell assembly further comprises a plurality of metal counter-electrodes. Each respective metal counter-electrode in the plurality of metal counter-electrodes joins together, lengthwise, elongated solar cells in a corresponding solar cell pair in the plurality of solar cell pairs. The solar cell assembly further comprises a transparent electrically insulating substrate that covers all or a portion of the first face of the planar array. A first solar cell pair and a second solar cell pair in the plurality of elongated solar cells are electrically connected in series by an electrical contact that electrically connects the first electrode of each elongated solar cell in the first solar cell pair to the corresponding counter-electrode of the second solar cell pair.

Still another aspect of the invention is directed to a solar cell assembly comprising a plurality of elongated solar cells. Each elongated solar cell in the plurality of elongated solar cells comprises (i) a conductive core configured as a first electrode, (ii) a semiconductor junction circumferentially disposed on the conductive core, and (iii) a transparent conductive oxide layer disposed on said semiconductor junction. The plurality of elongated solar cells is geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly in accordance with this aspect of the invention further comprises a plurality of metal counter-electrodes. Each respective elongated solar cell in the plurality of elongated solar cells is bound to a first corresponding metal counter-electrode in the plurality of metal counter-electrodes such that the first metal counter-electrode lies in a first groove that runs lengthwise on the respective elongated solar cell. The solar cell assembly further comprises a transparent electrically insulating substrate that covers all or a portion of the first face of the planar array. Furthermore, a first and second elongated solar cell in the plurality of elongated solar cells are electrically connected in series by an electrical contact that connects the first electrode of the first elongated solar cell to the first corresponding counter-electrode of the second elongated solar cell. In addition, the plurality of elongated solar cells is configured to receive direct light from the first face and the second face of the planar array.

Yet another aspect of the invention provides a solar cell assembly comprising a plurality of elongated solar cells. Each elongated solar cell in the plurality of elongated solar cells comprises (i) a conductive core configured as a first electrode, (ii) a semiconductor junction circumferentially disposed on the conductive core, and (iii) a transparent conductive oxide layer disposed on the semiconductor junction. The plurality of elongated solar cells is geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly in accordance with this aspect of the invention further comprises a plurality of metal counter-electrodes. Each respective elongated solar cell in the plurality of elongated solar cells is bound to a first corresponding metal counter-electrode and a second corresponding metal counter-electrode in the plurality of metal counter-electrodes such that the first metal counter-electrode lies in a first groove that runs lengthwise on the respective elongated solar cell and the second metal counter-electrode lies in a second groove that runs lengthwise on the respective elongated solar cell. The first groove and the second groove are on opposite sides of the respective elongated solar cell. The solar cell assembly in accordance with this aspect of the invention further comprises a transparent electrically insulating substrate that covers all or a portion of the first face of the planar array. In this aspect of the invention, a first and second elongated solar cell in the plurality of elongated solar cells is electrically connected in series.

4. BRIEF DESCRIPTION OF THE DRAWINGS

FIG. 3B is a cross-sectional view of an elongated solar cell in accordance with the prior art.

FIG. 3C is a cross-sectional view of a solar cell assembly in which a plurality of elongated solar cells are affixed to an electrically conductive substrate in accordance with the prior art.

FIG. 4A is a cross-sectional view of elongated solar cells electrically arranged in series and geometrically arranged in a parallel or near parallel manner on counter-electrodes that contact a substrate in order to form a bifacial assembly, in accordance with an embodiment of the present invention.

Like reference numerals refer to corresponding parts throughout the several views of the drawings. Dimensions are not drawn to scale.

5. DETAILED DESCRIPTION

Figure 1:
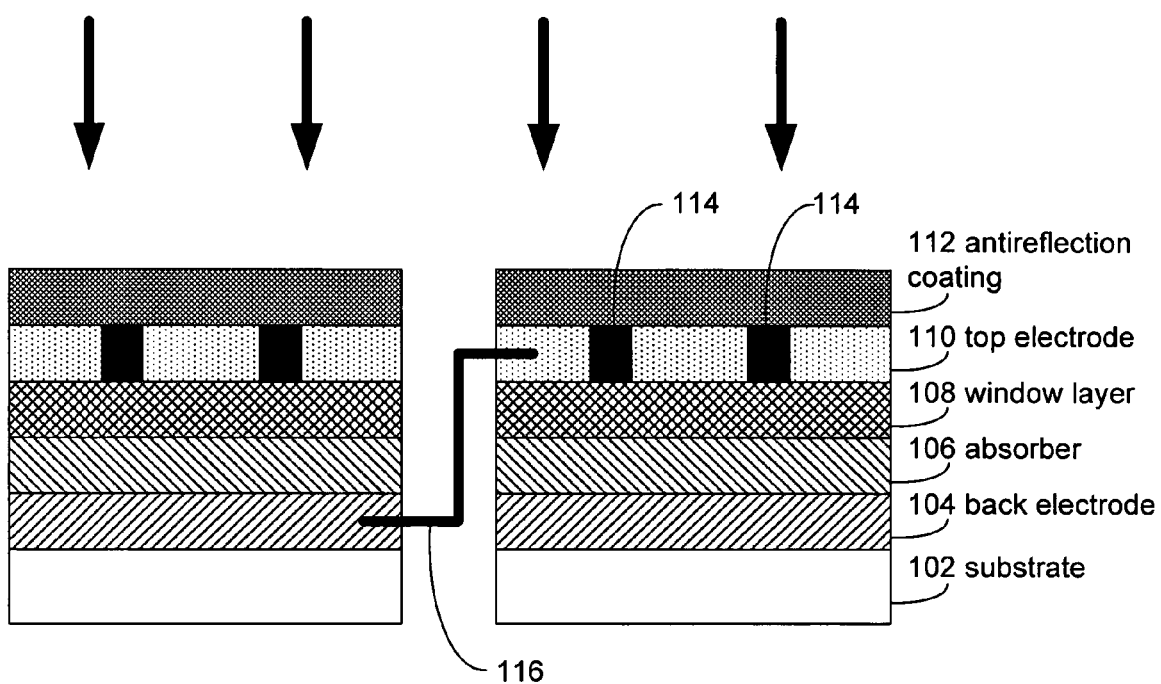
FIG. 1 illustrates interconnected solar cells in accordance with the prior art.
Figure 2:
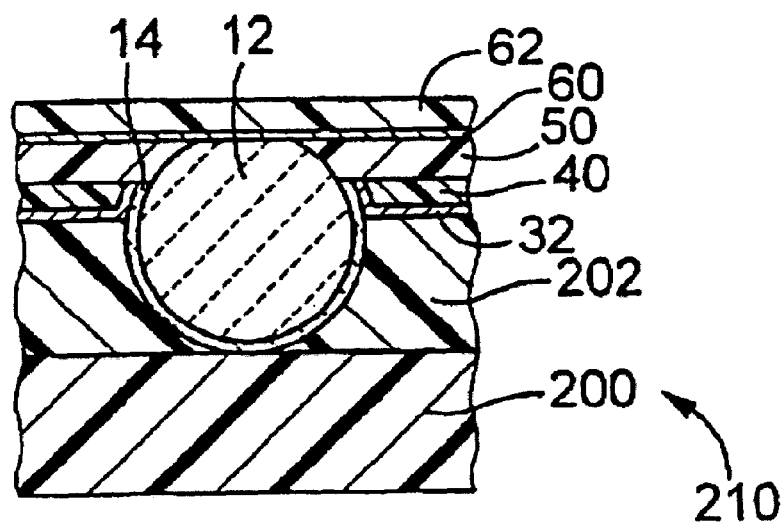
FIG. 2 illustrates a spherical solar cell including a p-type inner layer and an n-type outer layer in accordance with the prior art.

Disclosed herein are solar cell assemblies for converting solar energy into electrical energy and more particularly to improved solar cells and solar cell arrays. The solar cells of the present invention have a wire shape and are arranged in parallel but are electrically connected in series.

5.1 Basic Structure

The present invention provides a solar cell assembly 400 in which elongated solar cells 402, shown in cross-section in FIG. 4A, serve to absorb light. A conductive core (elongated conductive core) 404 serves as the first electrode in the assembly and a transparent conductive oxide (TCO) 412 on the exterior surface of each solar cell serves as the counter electrode.

In general, conductive core 404 is made out of any material such that it can support the photovoltaic current generated by solar cell with negligible resistive losses. In some embodiments, conductive core 404 is composed of any conductive material, such as aluminum, molybdenum, steel, nickel, silver, gold, or an alloy thereof. In some embodiments, conductive core 404 is made out of a metal-, graphite-, carbon black-, or superconductive carbon black-filled oxide, epoxy, glass, or plastic. In some embodiments, conductive core 404 is made of a conductive plastic. As defined herein, a conductive plastic is one that, through compounding techniques, contains conductive fillers which, in turn, impart their conductive properties to the plastics system. The conductive plastics used in the present invention to form conductive core 404 contain fillers that form sufficient conductive current-carrying paths through the plastic matrix to support the photovoltaic current generated by solar cell with negligible resistive losses. The plastic matrix of the conductive plastic is typically insulative, but the composite produced exhibits the conductive properties of the filler.

A semiconductor junction 410 is formed around conductive core 404. Semiconductor junction 410 is any photovoltaic homojunction, heterojunction, heteroface junction, burried homojunction, or p-i-n junction having an absorber layer that is a direct band-gap absorber (e.g., crystalline silicon) or an indirect band-gap absorber (e.g., amorphous silicon). Such junctions are described in Chapter 1 of Bube, *Photovoltaic Materials,* 1998, Imperial College Press, London, which is hereby incorporated by reference in its entirety. Details of exemplary types of semiconductors junctions 410 in accordance with the present invention are disclosed in Section 5.2, below. In addition to the exemplary junctions disclosed in Section 5.2, below, junctions 410 can be multijunctions in which light traverses into the core of junction 410 through multiple junctions that, preferably, have successfully smaller bandgaps.

Optionally, there is a thin intrinsic layer (i-layer) 415 between semiconductor junction 410 and an outer transparent conductive oxide (TCO) layer 412. The i-layer 415 can be formed using any undoped transparent oxide including, but not limited to, zinc oxide or indium-tin-oxide.

The transparent conductive oxide (TCO) layer 412 is built up on top of the semiconductor junction layers 410 thereby completing the circuit. As noted above, in some embodiments, there is a thin i-layer coating the semiconductor junction 410. In such embodiments, TCO layer 412 is built on top of the i-layer. In some embodiments, TCO layer 412 is made of tin oxide $SnO_x$ (with or without fluorine doping), indium-tin oxide (ITO), doped zinc oxide (ZnO) or any combination thereof. In some embodiments, TCO layer 412 is either p-doped or n-doped. For example, in embodiments where the outer semiconductor layer of junction 410 is p-doped, TCO layer 412 can be p-doped. Likewise, in embodiments where the outer semiconductor layer of junction 410 is n-doped, TCO layer 412 can be n-doped. In general, TCO layer 412 is preferably made of a material that has very low resistance, suitable optical transmission properties (e.g., greater than 90%), and a deposition temperature that will not damage underlying layers of semiconductor junction 410 and/or optional i-layer 415. In some embodiments, TCO 412 is an electrically conductive polymer material such as a conductive polytiophene, a conductive polyaniline, a conductive polypyrrole, a PSS-doped PEDOT (e.g., Bayrton), or a derivative of any of the foregoing. In some embodiments, TCO comprises more than one layer, including a first layer comprising tin oxide $SnO_x$ (with or without fluorine doping), indium-tin oxide (ITO), zinc oxide (ZnO) or a combination thereof and a second layer comprising a conductive polytiophene, a conductive polyaniline, a conductive polypyrrole, a PSS-doped PEDOT (e.g., Bayrton), or a derivative of any of the foregoing. Additional suitable materials that can be used to form TCO layer are disclosed in United States Patent publication 2004/0187917A1 to Pichler, which is hereby incorporated by reference in its entirety.

Rod-shaped (elongated) solar cells 402 are lined up multiply parallel. The entire assembly is sealed between electrically resistant transparent substrate 406 and a covering 422 using a sealant such as ethylene vinyl acetate. Covering 422 is generally made from the same materials as substrate 406. Suitable materials for covering 422 and substrate 406 include, but are not limited to glass or polyvinyl fluoride products such as Tedlar (DuPont, Wilmington, Del.).

Figure 3A:
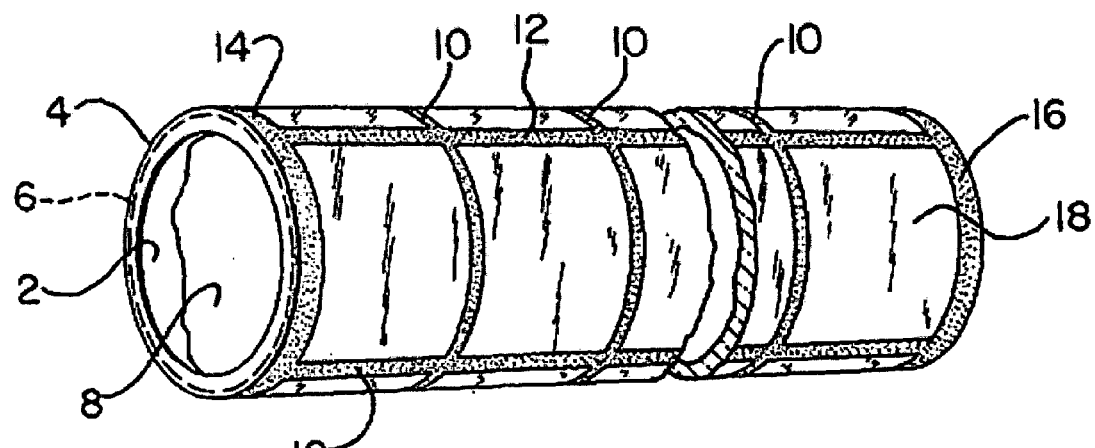
FIG. 3A illustrates a tubular photovoltaic element comprising a cylindrical silicon tube of n-type conductivity that has been subjected to diffusion of boron into its outer surface to form an outer p-conductivity type region and thus a tubular solar cell in accordance with the prior art.
Figure 3D:
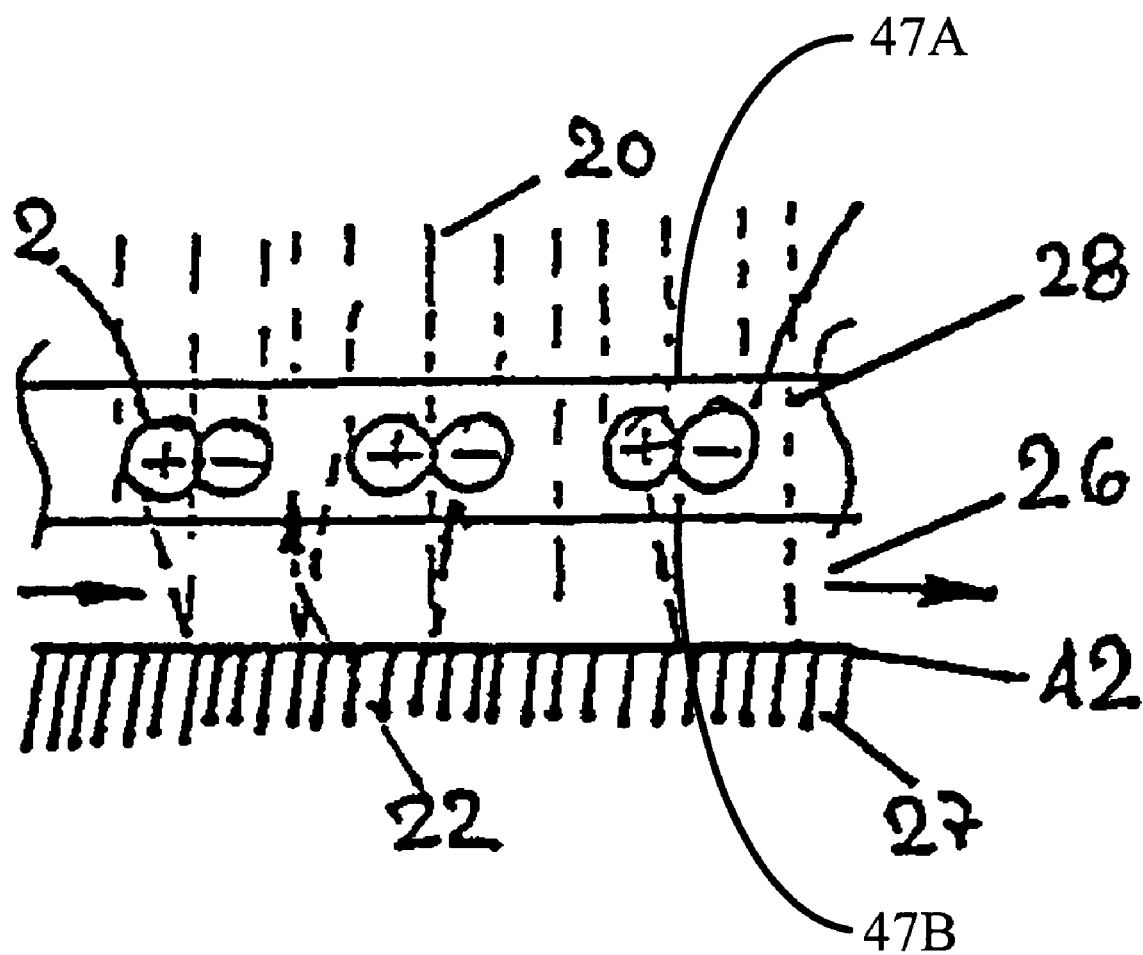
FIG. 3D is a cross-sectional view of a solar cell assembly disposed a distance away from a reflecting wall in accordance with the prior art.
Figure 4B:
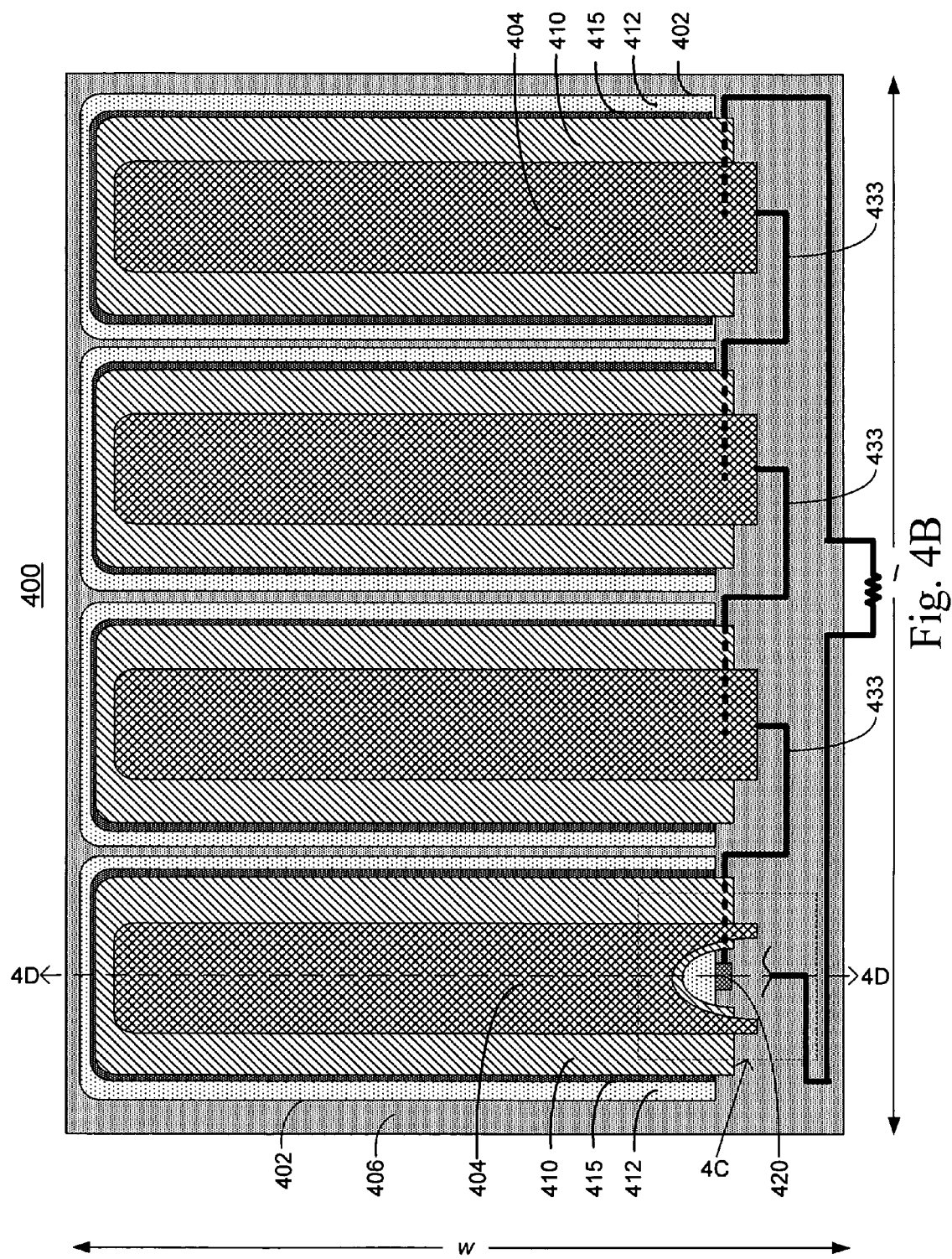
FIG. 4B is a cross-sectional view taken about line 4B—4B of FIG. 4A depicting the serial electrical arrangement of tubular solar cells in a bifacial assembly in accordance with an embodiment of the present invention.

FIG. 4B provides a cross-sectional view with respect to line 4B—4B of FIG. 4A. As can be seen with FIGS. 4A and 4B, each elongated cell 402 has a length that is great compared to the diameter d of its cross-section. An advantage of the architecture shown in FIG. 4A is that there is no front side contact that shades solar cells 402. Such a front side contact is found in known devices (e.g., elements 10 of FIG. 3). Another advantage of the architecture shown in FIG. 4A is that elongated cells 402 are electrically connected in series rather than in parallel. In such a series configuration, the voltage of each elongated cell 402 is summed. This serves to increase the voltage across the system, thereby keeping the current down, relative to comparable parallel architectures, and minimizing resistive losses. A serial electrical arrangement is maintained by arranging all or a portion of the elongated solar cells 402 such that they do not touch each other, as illustrated in FIGS. 4A and 4B. The separation distance between solar cells 402 is any distance that prevents electrical contact between solar cells 402. For instance, in some embodiments, the distance between adjacent solar cells 402 is 0.1 micron or greater, 0.5 microns or greater, or between 1 and 5 microns.

Another advantage of the architecture shown in FIG. 4A is that the resistance loss across the system is low. This is because each electrode component of the circuit is made of highly conductive material. For example, as noted above, conductive core 404 of each solar cell 402 is made of a conductive metal. Furthermore, each conductive core 404 has a diameter that is large enough to carry current without an appreciable current loss due to resistance. While larger conductive cores 404 ensure low resistance, TCO layers encompassing such larger conductive cores 404 must carry current further to contacts (counter-electrode strip) 420. Thus, there is an upper bound on the size of conductive cores 404. In view of these and other considerations, diameter d is between 0.5 millimeters (mm) and 20 mm in some embodiments of the present invention. Thus, conductive cores 404 are sized so that they are large enough to carry a current without appreciable resistive loss, yet small enough to allow TCO 412 to efficiently deliver current to leads 420. With this balanced design, resistive loss is minimized and an efficient solar cell assembly 400 is realized.

The advantageous low resistance nature of the architecture illustrated in FIG. 4A is also facilitated by the highly conductive properties of leads 420. In some embodiments, for example, leads 420 are composed of a conductive epoxy (e.g., silver epoxy) or conductive ink and the like.

There are a number of different ways in which elongated cells 402 can be packaged in order to form solar cell assembly 400. For example, in one embodiment, leads 420 are formed by depositing a thin metallic layer on substrate 406 and then patterning the layer into a series of parallel strips, where each strip runs the length of a solar cell 402. Then, elongated solar cells 402 are affixed to substrate 406 by leads 420 using a conductive epoxy. In some embodiments, leads 420 are formed directly on solar cells 402 and solar cells 402 are not affixed to substrate 406. In such embodiments, there are at least two different ways in which elongated solar cells 402 can be packaged to form solar cell assembly 400. In a first approach, elongated solar cells 402, having leads 420 as illustrated in FIG. 4A, rest on substrate 406 but are not affixed to the substrate. In a second approach, elongated solar cells 402, having leads 420 as illustrated in FIG. 4A, do not contact substrate 406. This second approach is not illustrated. In this second approach, a layer of ethylene vinyl acetate or some other suitable transparent material separates contacts 420 from substrate 406.

Still another advantage of the architecture illustrated in FIG. 4A is that the path length through the absorber layer (e.g., layer 502, 510, 520, or 540 of FIG. 5) of semiconductor junction 410 is, on average, longer than the path length through of the same type of absorber layer having the same width but in a planar configuration. Thus, the elongated architecture illustrated in FIG. 4A allows for the design of thinner absorption layers relative to analogous planar solar cell counterparts. In the elongated architecture, the thinner absorption layer absorbs the light because of the increased path length through the layer. Because the absorption layer is thinner relative to comparable planar solar cells, there is less resistance and, hence, an overall increase in efficiency in the cell relative to analogous planar solar cells. Additional advantages of having a thinner absorption layer that still absorbs sufficient amounts of light is that such absorption layers require less material and are thus cheaper. Furthermore, thinner absorption layers are faster to make, thereby further lowering production costs.

Another advantage of elongated solar cells 402 illustrated in FIG. 4A is that they have a relatively small surface area, relative to comparable planar solar cells, and they possess radial symmetry. Each of these properties allow for the controlled deposition of doped semiconductor layers necessary to form semiconductor junction 410. The smaller surface area, relative to conventional flat panel solar cells, means that it is easier to present a uniform vapor across the surface during deposition of the layers that form semiconductor junction 410. The radial symmetry can be exploited during the manufacture of the cells in order to ensure uniform composition (e.g., uniform material composition, uniform dopant concentration, etc.) and/or uniform thickness of individual layers of semiconductor junction 410. For example, the conductive core 404 upon which layers are deposited to make solar cells 402 can be rotated along its longitudinal axis during such deposition in order to ensure uniform material composition and/or uniform thickness.

The cross-sectional shape of solar cells 402 is generally circular in FIG. 4B. In other embodiments, solar cell 402 bodies with a quadrilateral cross-section or an elliptical shaped cross-section and the like are used. In fact, there is no limit on the cross-sectional shape of solar cells 402 in the present invention, so long as the solar cells 402 maintain a general overall rod-like or wire-like shape in which their length is much larger than their diameter and they possess some form of cross-sectional radial symmetry.

As illustrated in FIG. 4B, assembly 400 comprises many elongated solar cells 402 geometrically arranged in parallel fashion and electrically connected in series. For example, a first and second elongated solar cell (rod-shaped solar cell) 402 are electrically connected in series by an electrical contact 433 that connects the conductive core 404 (first electrode) of the first elongated solar cell 402 to the corresponding counter-electrode strip 420 electrode strip of the second elongated solar cell. Thus, as illustrated in FIG. 4A, elongated solar cells 402 are the basic unit that respectively forms the semiconductor layer 410, the TCO 412, and the metal conductive core 404 of the elongated solar cell 402. The elongated solar cells 402 are multiply arranged in a row parallel or nearly parallel with respect to each other and rest upon independent leads (counter electrodes) 420 that are electrically isolated from each other. Advantageously, in the configuration illustrated in FIG. 4A, elongated solar cells 402 can receive direct light either through substrate 406, covering 422, or both substrate 406 and covering 422.

In some embodiments, not all elongated solar cells 402 in assembly 400 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

In some embodiments, rather than packaging solar cells 402 between a substrate 406 and cover 422 using a sealant such as ethylene vinyl acetate, solar cells 402 arranged in the same planar parallel configuration illustrated in FIGS. 4A and 4B are encased in a rigid transparent film. Suitable materials for such a rigid transparent film include, but are not limited to, polyvinyl fluoride products such as Tedlar (DuPont, Wilmington, Del.).

Figure 4C:
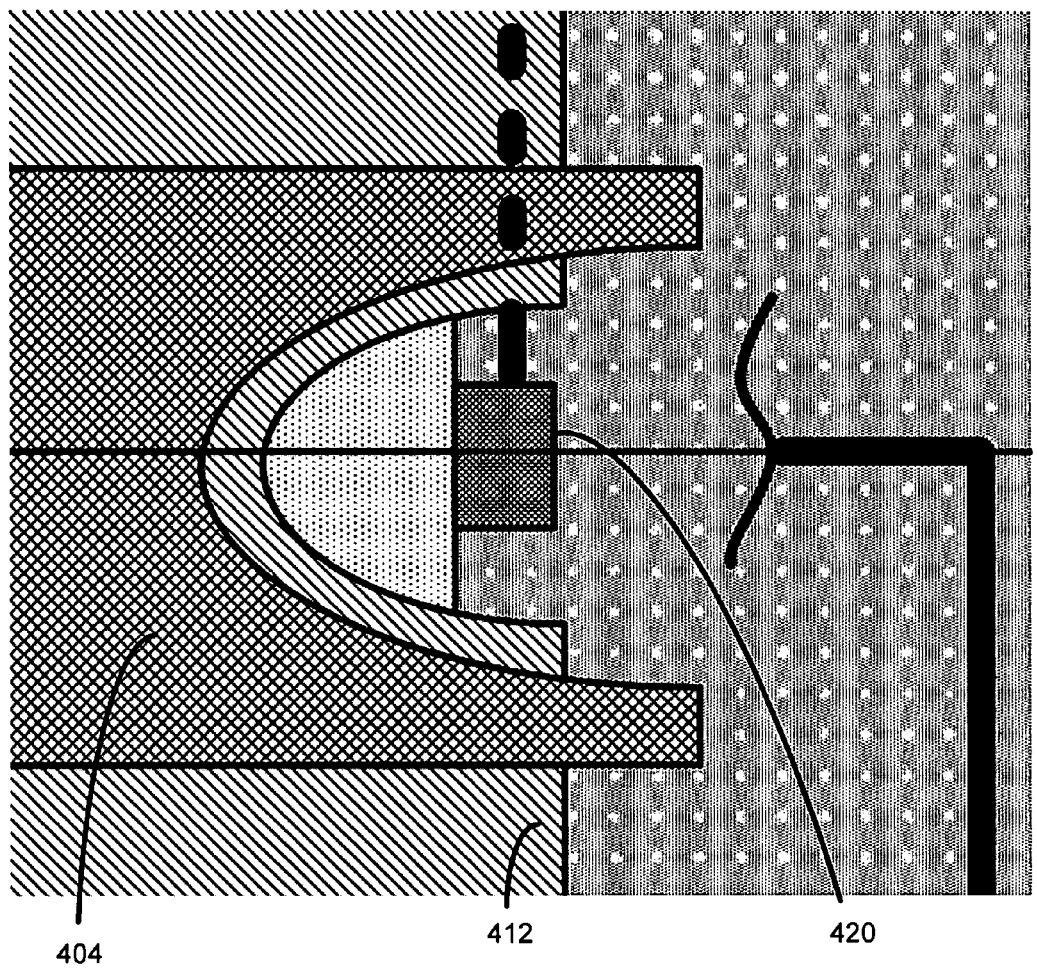
FIG. 4C is a blow-up perspective view of region 4C of FIG. 4B, illustrating various layers in elongated solar cells in accordance with one embodiment of the present invention.

FIG. 4C is an enlargement of region 4C of FIG. 4B in which a portion of conductive core 404 and transparent conductive oxide (TCO) 412 have been cut away to illustrate the positional relationship between counter-electrode strip 420, elongated cell 402, and electrically resistant transparent substrate 406. Furthermore FIG. 4C illustrates how electrical contact 433 joins the conductive core 404 of one elongated solar cell 402 to the counter-electrode 420 of another solar cell 402.

One advantage of the configuration illustrated in FIG. 4 is that electrical contacts 433 that serially connect solar cells 402 together only need to be placed on one end of assembly 400, as illustrated in FIG. 4B. Thus, referring to FIG. 4D, which is a cross-sectional view of a elongated solar 402 cell taken about line 4D—4D of FIG. 4B, it is possible to completely seal far-end 455 of solar cell 402 in the manner illustrated. In some embodiments, the layers in this seal are identical to the layers circumferentially disposed lengthwise on conductive core 404, namely, in order of deposition on conductive core 404, semiconductor junction 410, optional thin intrinsic layer (i-layer) 415, and transparent conductive oxide (TCO) layer 412. In such embodiments, end 455 can receive sun light and therefore contribute to the electrical generating properties of the solar cell 402.

Figure 4D:
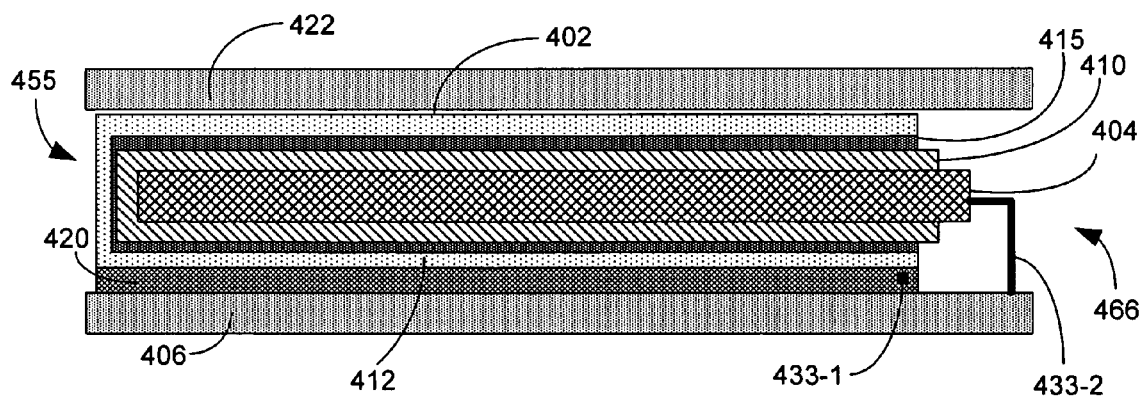
FIG. 4D is a cross-sectional view of an elongated solar cell taken about line 4D—4D of FIG. 4B, in accordance with an embodiment of the present invention.

FIG. 4D also illustrates how the various layers deposited on conductive core 404 are tapered at end 466 where electrical contacts 433 are found. For instance, a terminal portion of conductive core 404 is exposed, as illustrated in FIG. 4D. In other words, semiconductor junction 410, optional i-layer 415, and TCO 412 are stripped away from a terminal portion of conductive core 404. Furthermore, a terminal portion of semiconductor junction 410 is exposed as illustrated in FIG. 4D. That is, optional i-layer 415 and TCO 412 are stripped away from a terminal portion of semiconductor junction 410. Such a configuration is advantageous because it prevents a short from developing between TCO 412 and conductive core 404. In FIG. 4D, elongated solar cell 402 is positioned on counter-electrode strip 420 which, in turn, is positioned onto electrically resistant transparent substrate 406. However, there is no requirement that counter-electrode strip 420 make contact with electrically resistant transparent substrate 406. In fact, in some embodiments, elongated solar cells 402 and their corresponding electrode strips 420 are sealed between electrically resistant transparent substrate 406 and covering 422 in such a manner that they do not contact substrate 406 and covering 422. In such embodiments, elongated solar cells 402 and corresponding electrode strips 420 are fixedly held in place by a sealant such as ethylene vinyl acetate.

FIG. 4D further provides a perspective view of electrical contacts 433 that serially connect elongated solar cells 402. For instance, a first electrical contact 433-1 electrically interfaces with counter-electrode 420 whereas a second electrical contact 433-2 electrically interfaces with conductive core 404 (the first electrode of elongated solar cell 402). First electrical contact 433-1 serially connects the counter-electrode of elongated solar cell 402 to the conductive core 404 of another elongated solar cell 402 in assembly 400. Second electrical contact 433-2 serially connects the conductive core 404 of elongated solar cell 402 to the counter-electrode 420 of another elongated solar cell 402 in assembly 400.

Figure 4E:
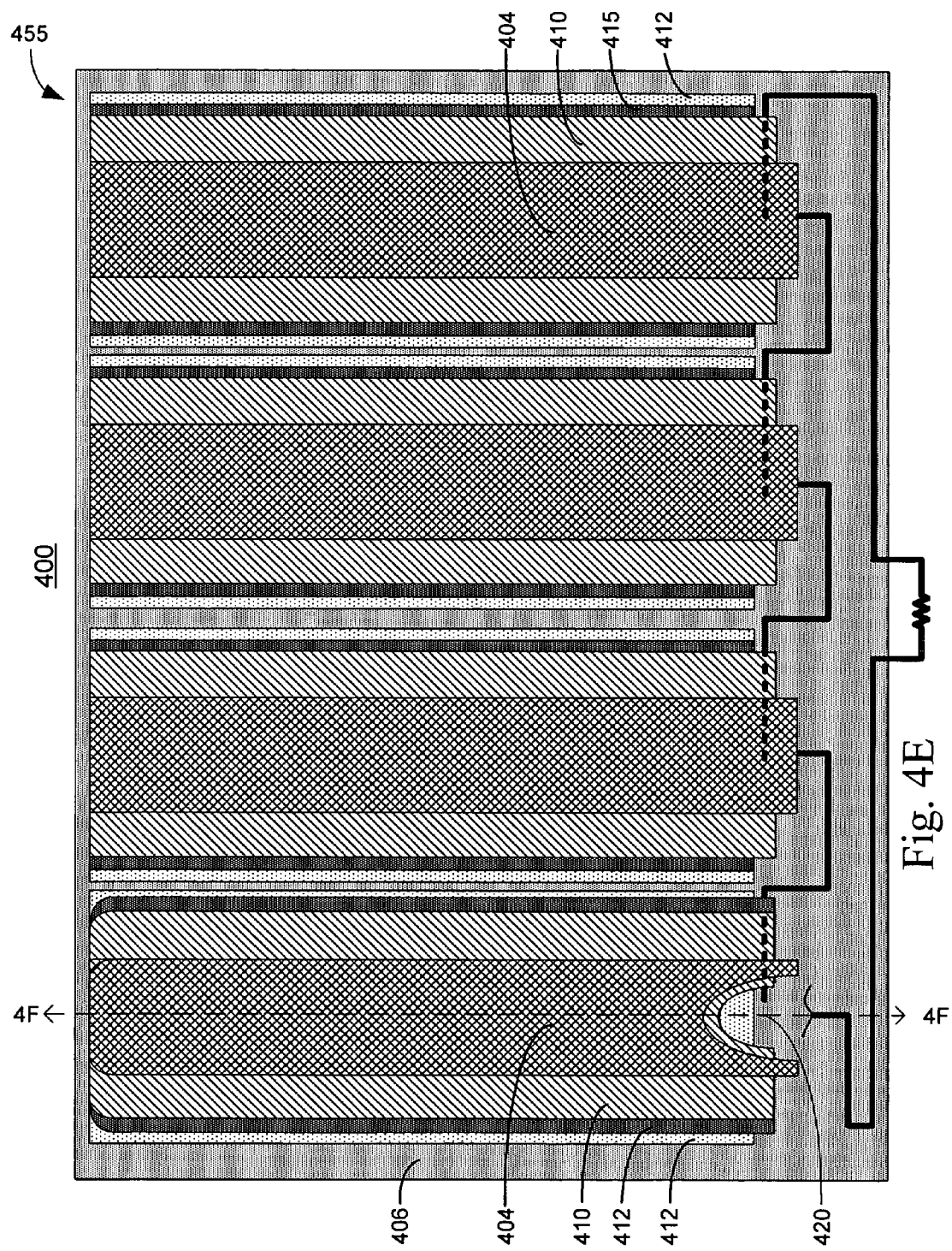
FIG. 4E is a cross-sectional view taken about line 4B—4B of FIG. 4A that depicts the serial arrangement of tubular solar cells in a bifacial assembly in accordance with an alternative embodiment of the present invention.
Figure 4F:
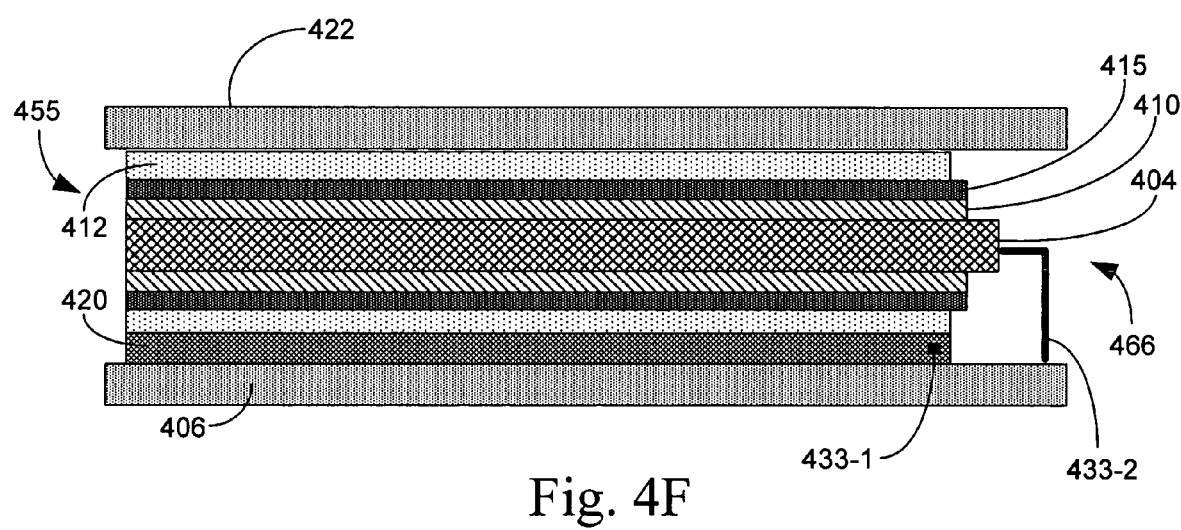
FIG. 4F is a cross-sectional view of a elongated solar cell taken about line 4F—4F of FIG. 4E, in accordance with an embodiment of the present invention.

FIG. 4E provides a cross-sectional view with respect to line 4B—4B of FIG. 4A in accordance with another embodiment of the present invention. FIG. 4E is similar to FIG. 4B. However, in FIG. 4E, elongated solar cells 402 facing end 455 are not sealed as they are in FIG. 4B and FIG. 4D. Thus, the ends of elongated solar cells 402 facing end 455 cannot contribute to the photovoltaic potential of solar cell 402. However, the embodiment illustrated in FIG. 4E has the advantage of being easier to make than the embodiment illustrated in FIGS. 4B and 4D. Furthermore, in many instances, the loss of contribution to the photovoltaic potential from end 455 is negligible because the surface area of such ends is so small. FIG. 4F is a cross-sectional view of a elongated solar 402 cell taken about line 4F—4F of FIG. 4E which further illustrates the configuration of end 455 of elongated solar cell 402 in accordance with the embodiment of the invention illustrated in FIG. 4E.

Figure 6A:
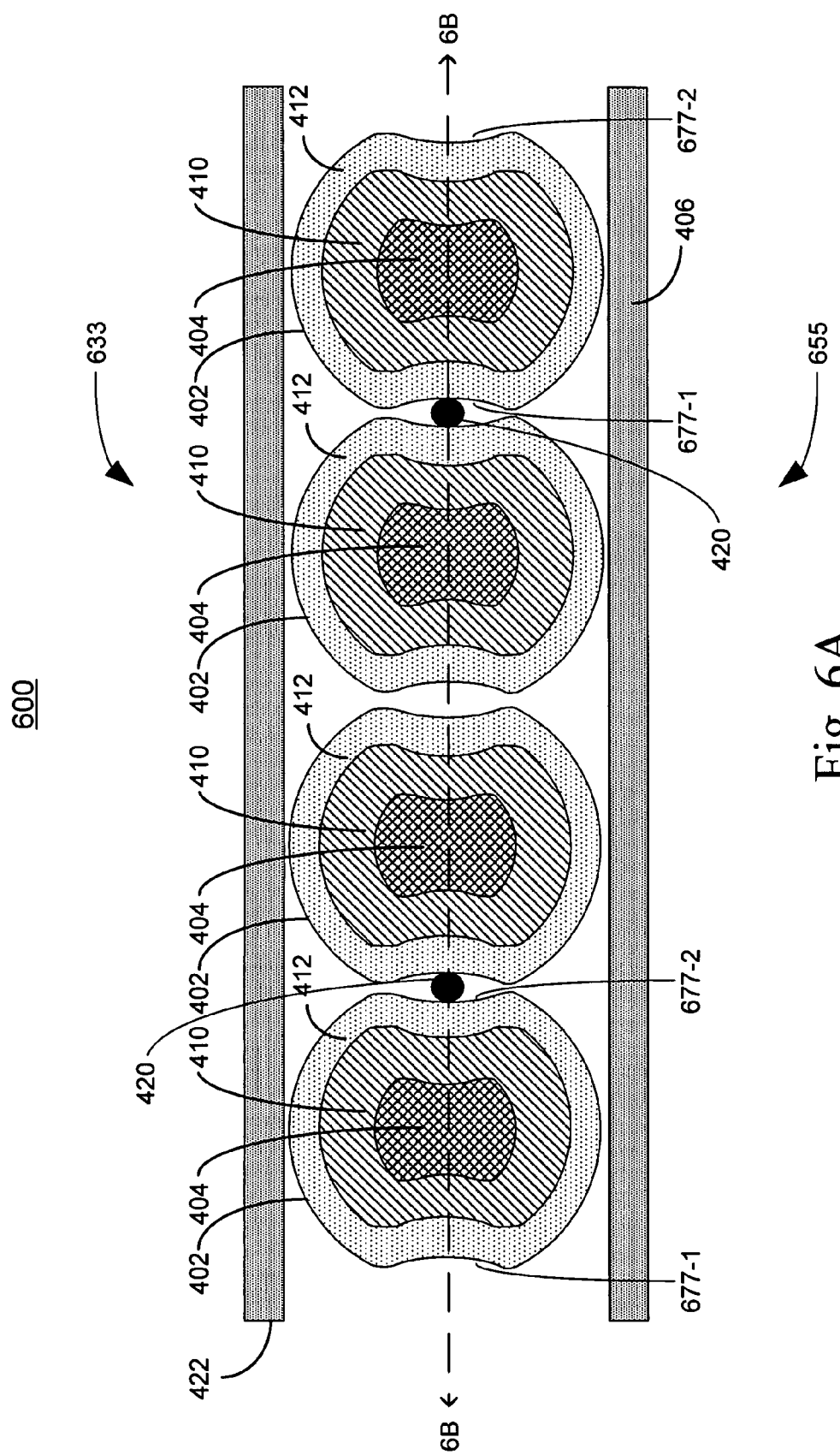
FIG. 6A is a cross-sectional view of elongated solar cells electrically arranged in series in a bifacial assembly where counter-electrodes form interfaces between solar cell pairs, in accordance with another embodiment of the present invention.

FIG. 6 illustrates a solar cell assembly 600 in accordance with the present invention. Specifically, FIG. 6A is a cross-sectional view of rod-shaped (elongated) solar cells 402 electrically arranged in series in a bifacial assembly 600 where counter-electrodes 420 form interfaces between solar cell pairs 402. As illustrated in FIG. 6A, solar cell assembly 600 comprises a plurality of elongated solar cells 402. There is no limit to the number of solar cells 402 in this plurality (e.g., 1000 or more, 10,000 or more, between 5,000 and one million solar cells 402, etc.). As in the embodiment of the invention illustrated in FIG. 4 and described above, each elongated solar cell 402 comprises a conductive core 404 with a semiconductor junction 410 circumferentially disposed on the conductive core. A transparent conductive oxide layer 412 circumferentially disposed on the semiconductor junction 412 completes the circuit.

Figure 6B:
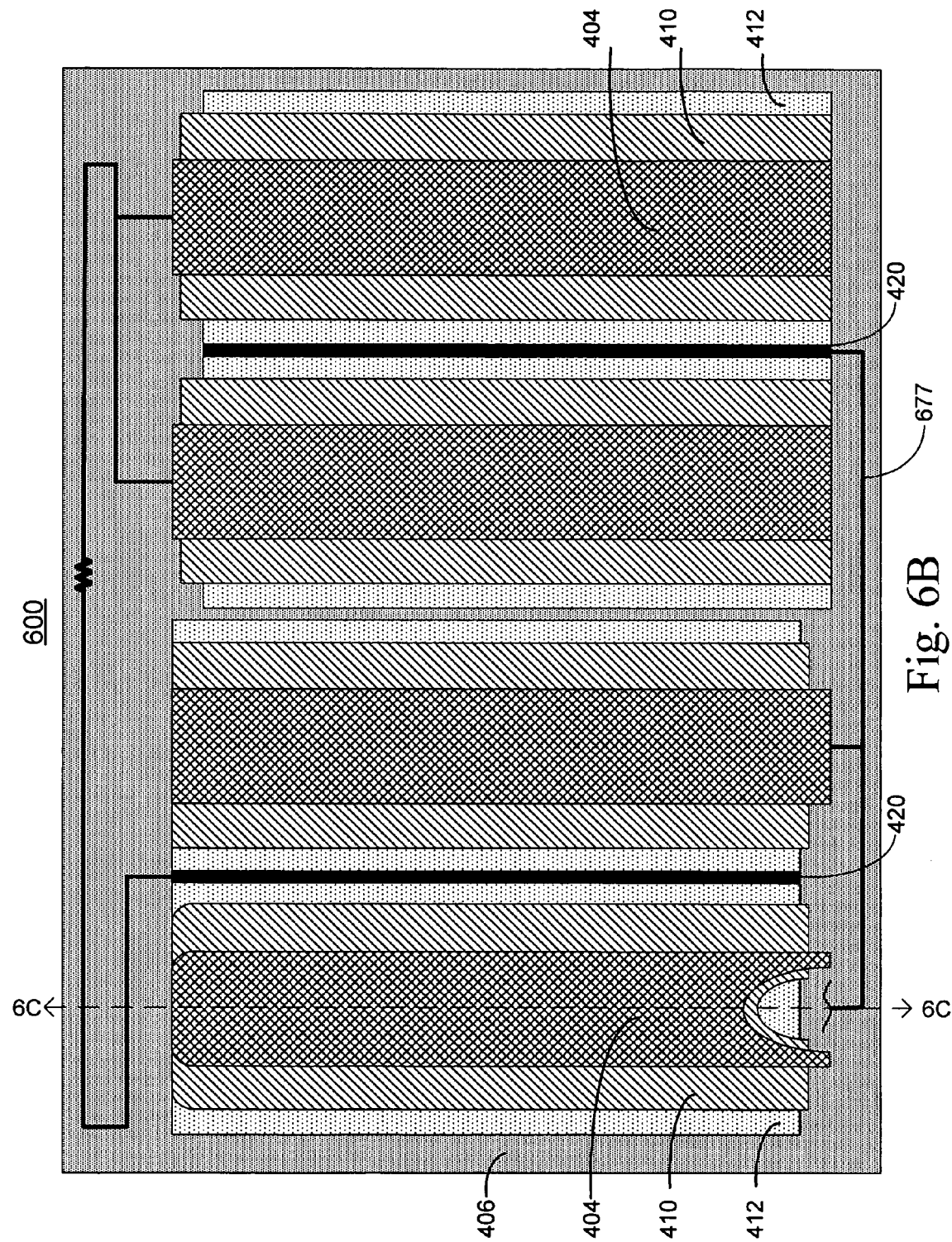
FIG. 6B is a cross-sectional view taken about line 6B—6B of FIG. 6A that depicts the serial arrangement of tubular solar cells in a bifacial assembly in accordance with an embodiment of the present invention.

As illustrated in FIGS. 6A and 6B, the plurality of elongated solar cells 402 are geometrically arranged in a parallel or near parallel manner as a plurality of solar cell pairs so as to form a planar array having a first face (on side 633 of assembly 600 as illustrated in FIG. 6A) and a second face (on side 655 of assembly 600 as illustrated in FIG. 6A). Solar cells 402 in a pair of solar cells do not touch the solar cells 402 in an adjacent pair of solar cells. However, in the embodiment illustrated in FIG. 6, solar cells 402 within a given pair of solar cells are in electrical contact with each other through their common counter-electrode 420. Accordingly, assembly 600 comprises a plurality of metal counter-electrodes 420. Each respective metal counter-electrode in the plurality of metal counter-electrodes joins together, lengthwise, elongated solar cells 402 in a corresponding solar cell pair in the plurality of solar cell pairs. As such, elongated solar cells 402 in a solar cell pair are electrically arranged in parallel, not series.

In some embodiments there is a first groove 677-1 and a second groove 677-2 that each runs lengthwise on opposing sides of solar cell 402. In FIG. 6A, some but not all grooves 677 are labeled. In some embodiments, the counter-electrode 420 of each pair of solar cells 402 is fitted between opposing grooves 677 in the solar cell pair in the manner illustrated in FIG. 6A. The present invention encompasses grooves 677 that have a broad range of depths and shape characteristics and is by no means limited to the shape of the grooves 677 illustrated in FIG. 6A. In general, any type of groove 677 that runs along the long axis of a first solar cell 402 in a solar cell pair and that can accommodate all or part of counter-electrode 420 in a pairwise fashion together with an opposing groove on the second solar cell 402 in the solar cell pair is within the scope of the present invention.

As illustrated in FIG. 6A, a transparent electrically insulating substrate 406 covers all or a portion of face 655 of the planar array of solar cells. In some embodiments, solar cells 402 touch substrate 406. In some embodiments, solar cells 402 do not touch substrate 406. In embodiments in which solar cells 402 do not touch substrate 406, a sealant such as ethylene vinyl acetate is used to seal substrate 406 onto solar cells 402.

FIG. 6B provides a cross-sectional view with respect to line 6B—6B of FIG. 6A. As can be seen in FIGS. 6A and 6B, each elongated solar cell 402 has a length that is great compared to the diameter of its cross-section. Typically each solar cell 402 has a rod-like shape (e.g., has a wire shape). Each solar cell pair is electrically connected to other solar cell pairs in series by arranging the solar cell pairs such that they do not touch each other, as illustrated in FIGS. 4A and 4B. The separation distance between solar cells pairs is any distance that prevents electrical contact between the cells. For instance, in some embodiments, the distance between adjacent solar cell pairs is 0.1 micron or greater, 0.5 microns or greater, or between 1 and 5 microns. Serial electrical contact between solar cell pairs is made by electrical contacts 677 that electrically connect the conductive cores 404 of each elongated solar cell in a one solar cell pair to the corresponding counter-electrode 120 of a different solar cell pair as illustrated in FIG. 6B. FIG. 6B further illustrates a cutaway of conductive core 404 and semiconductor junction 410 in one solar cell 402 to further illustrate the architecture of the solar cells.

Referring back to FIG. 6A, in some embodiments, solar cell assembly 600 further comprises a transparent insulating covering 422 disposed on face 633 of the planar array of solar cells 402, thereby encasing the plurality of elongated solar cells 402 between the transparent insulating covering 422 and the transparent electrically insulating substrate 406. In such embodiments, transparent insulating covering 422 and the transparent insulating substrate 406 are bonded together by a sealant such as ethyl vinyl acetate. Although not illustrated in FIGS. 6A and 6B, in preferred embodiments, there is an intrinsic layer circumferentially disposed between the semiconductor junction 410 and TCO 412. In some embodiments, this intrinsic layer is formed by an undoped transparent oxide such as zinc oxide, indium-tin-oxide, or a combination thereof.

Figure 9:
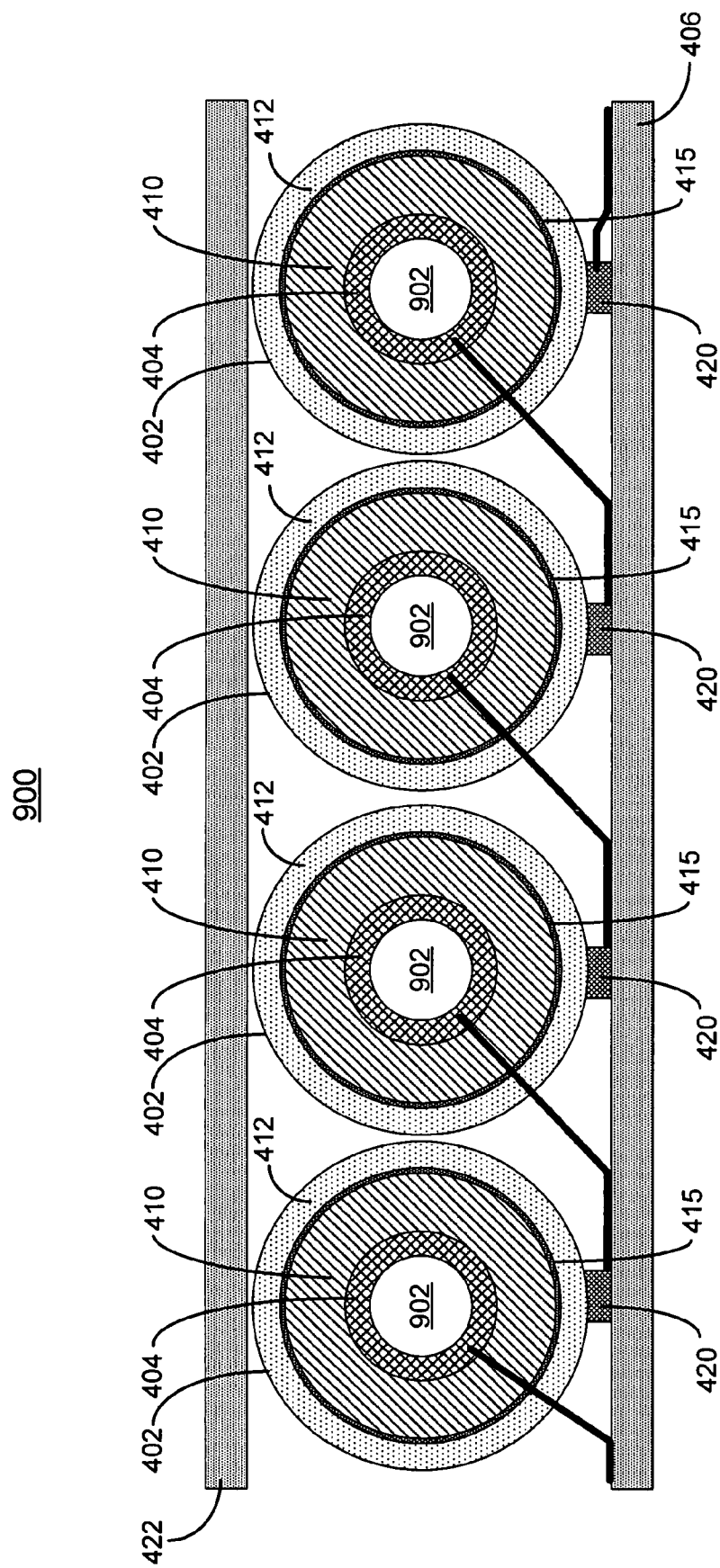
FIG. 9 is a cross-sectional view of elongated solar cells electrically arranged in series in a bifacial assembly in which the inner metal electrode is hollowed, in accordance with an embodiment of the present invention.

In some embodiments, the semiconductor junction 410 of solar cells 402 in assembly 600 comprise an inner coaxial layer and an outer coaxial layer, where the outer coaxial layer comprises a first conductivity type and the inner coaxial layer comprises a second, opposite, conductivity type. In some embodiments, the inner coaxial layer comprises copper-indium-gallium-diselenide (CIGS) and the outer coaxial layer comprises CdS, $SnO_2$, ZnO, $ZrO_2$, or doped ZnO. In some embodiments, conductive core 404 and/or electrical contacts 677 and/or counter-electrodes 420 are made of aluminum, molybdenum, steel, nickel, silver, gold, or an alloy thereof. In some embodiments, transparent conductive oxide layer 412 is made of tin oxide $SnO_x$, with or without fluorine doping, indium-tin oxide (ITO), zinc oxide (ZnO) or a combination thereof. In some embodiments, transparent insulating substrate 406 and transparent insulating covering 422 comprise glass or Tedlar. Although not shown in FIG. 6, in some embodiments, conductive core 404 is hollowed as depicted in FIG. 9.

Figure 6C:
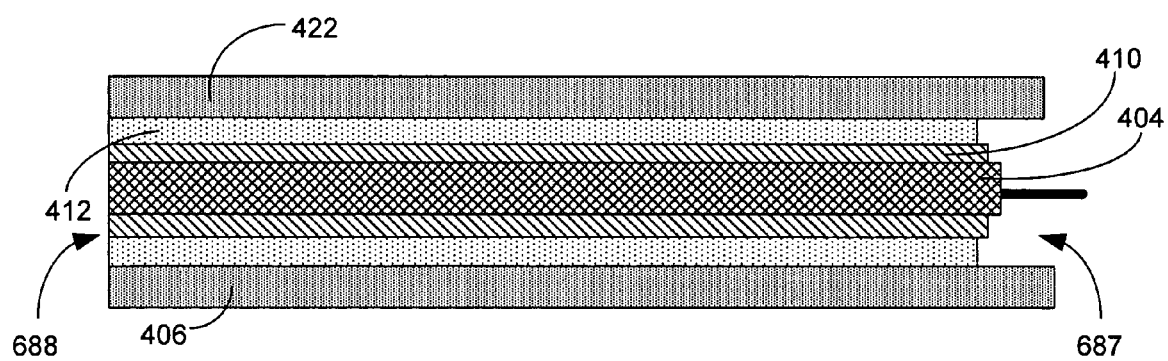
FIG. 6C is a cross-sectional view of an elongated solar cell taken about line 6C—6C of FIG. 6B, in accordance with an embodiment of the present invention.

FIG. 6C illustrates a cross-sectional view of an elongated solar 402 cell taken about line 6C—6C of FIG. 46. FIG. 6C illustrates how the various layers deposited on conductive core 404 are tapered at either end 687 or 688 (end 687 as illustrated in FIG. 6C). For instance, a terminal portion of conductive core 404 is exposed, as illustrated in FIG. 6C. In other words, semiconductor junction 410, an optional i-layer (not shown), and TCO 412 are stripped away from a terminal portion of conductive core 404 at an end of the solar cell. Furthermore, a terminal portion of semiconductor junction 410 is exposed as illustrated in FIG. 6C. That is, optional i-layer (not shown) and TCO 412 are stripped away from the terminal portion of semiconductor junction 410 at an end of the solar cell (end 687 in FIG. 6C). Such a configuration is advantageous because it prevents an electrical short from developing between TCO 412 and conductive core 404. In FIG. 6C, elongated solar cell 402 is positioned on electrically resistant transparent substrate 406. However, there is no requirement that elongated solar cell 402 make direct contact with electrically resistant transparent substrate 406. In fact, in some embodiments, elongated solar cells 402 are sealed between electrically resistant transparent substrate 406 and covering 422 in such a manner that they do not contact substrate 406 and covering 422. In such embodiments, elongated solar cells 402 are fixedly held in place by a sealant such as ethylene vinyl acetate.

In some embodiments, not all elongated solar cell pairs in assembly 600 are electrically arranged in series. For example, in some embodiments, two or more pairs of elongated solar cells are themselves paired such that all the elongated solar cells in the paired pairs are electrically arranged in parallel. This can be accomplished by joining the conductive core 404 of each of the solar cells by a common electrical contact (e.g., an electrically conducting wire, etc., not shown). To complete the parallel circuit, the TCO 412 of each of the elongated solar cell 402 are electrically joined together either by direct contact or by the use of a second electrical contact (not shown). The paired pairs of elongated solar cells are then electrically arranged in series. In some embodiments, three, four, five, six, seven, eight, nine, ten, eleven or more pairs of elongated solar cells are electrically arranged in parallel. These parallel groups of elongated solar cells 402 are then electrically arranged in series.

FIG. 7 illustrates solar cell assembly 700 in accordance with another embodiment of the present invention. Solar cell assembly 700 comprises a plurality of elongated solar cells 402. Each elongated solar cell 402 in the plurality of elongated solar cells has a conductive core 404 configured as a first electrode, a semiconductor junction 410 circumferentially disposed on the conductive core 402 and a transparent conductive oxide layer 412 disposed on the semiconductor junction 410. The plurality of elongated solar cells 402 are geometrically arranged in a parallel or a near parallel manner thereby forming a planar array having a first face (facing side 733 of assembly 700) and a second face (facing side 766 of assembly 700). The plurality of elongated solar cells is arranged such that one or more elongated solar cells in the plurality of elongated solar cells do not contact adjacent elongated solar cells. In preferred embodiments, the plurality of elongated solar cells is arranged such that each of the elongated solar cells in the plurality of elongated solar cells does not directly contact (through outer the TCO layer 412) adjacent elongated solar cells 402.

Figure 7A:
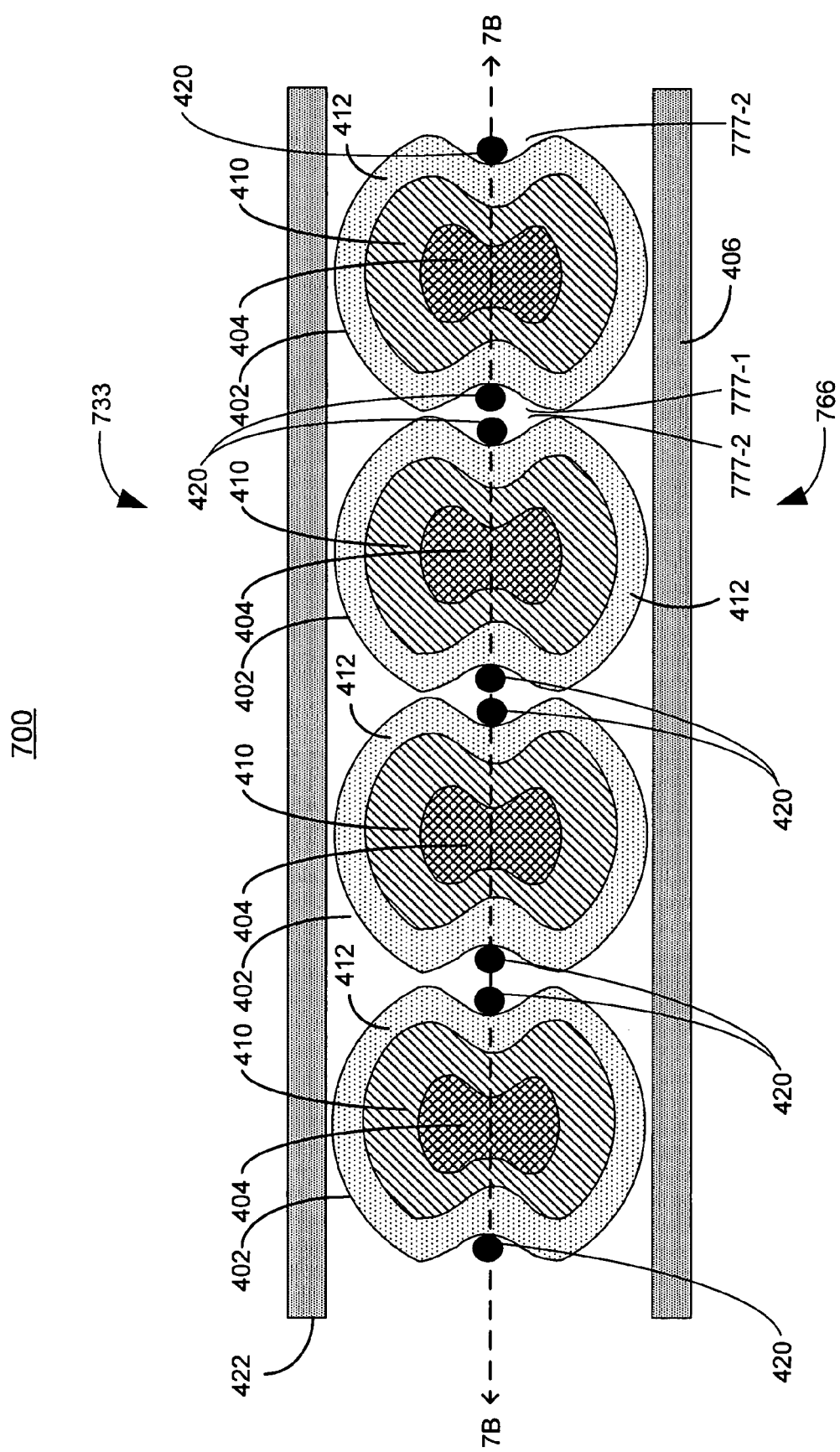
FIG. 7A is a cross-sectional view of elongated solar cells electrically arranged in series in a bifacial assembly where counter-electrodes abut individual solar cells, in accordance with another embodiment of the present invention.

In some embodiments there is a first groove 777-1 and a second groove 777-2 that each runs lengthwise on opposing sides of solar cell 402. In FIG. 7A, some but not all grooves 777 are labeled. In some embodiments, there is a counter-electrode 420 in one or both grooves of the solar cells. In the embodiment illustrated in FIG. 6A, there is a counter-electrode fitted lengthwise in both the first and second grooves of each solar cell in the plurality of solar cells. Such a configuration is advantageous because it reduces the pathlength of current drawn off of TCO 412. In other words, the maximum length that current must travel in TCO 412 before it reaches a counter-electrode 420 is a quarter of the circumference of the TCO. By contrast, in configurations where there is only a single counter-electrode 420 associated with a given solar cell 402, the maximum length that current must travel in TCO 412 before it reaches a counter-electrode 420 is a full half of the circumference of the TCO. The present invention encompasses grooves 777 that have a broad range of depths and shape characteristics and is by no means limited to the shape of the grooves 777 illustrated in FIG. 7A. In general, any groove shape 777 that runs along the long axis of a solar cell 402 and that can accommodate all or part of counter-electrode 420 is within the scope of the present invention. For example, in some embodiments not illustrated by FIG. 7A, each groove 777 is patterned so that there is a tight fit between the contours of the groove 777 and the counter-electrode 420.

As illustrated in FIG. 7A, there are a plurality of metal counter-electrodes 420, and each respective elongated solar cell 402 in the plurality of elongated solar cells is bound to at least a first corresponding metal counter-electrode 420 in the plurality of metal counter-electrodes such that the first metal counter-electrode lies in a groove 777 that runs lengthwise along the respective elongated solar cell. Furthermore, in the solar cell assembly illustrated in FIG. 7A, each respective elongated solar cell 402 is bound to a second corresponding metal counter-electrode 420 such that the second metal counter-electrode lies in a second groove 777 that runs lengthwise along the respective elongated solar cell 402. As further illustrated in FIG. 7A, the first groove 777 and the second groove 777 are on opposite or substantially opposite sides of the respective elongated solar cell 402 and run along the long axis of the cell.

Further illustrated in FIG. 7A, is a transparent electrically insulating substrate 406 that covers all or a portion of face 766 of the planar array. The plurality of elongated solar cells 402 are configured to receive direct light from both face 733 and face 766 of the planar array. Solar cell assembly 700 further comprises a transparent insulating covering 422 disposed on face 733 of the planar array, thereby encasing the plurality of elongated solar cells 402 between the transparent insulating covering 422 and the transparent electrically insulating substrate 406.

Figure 7B:
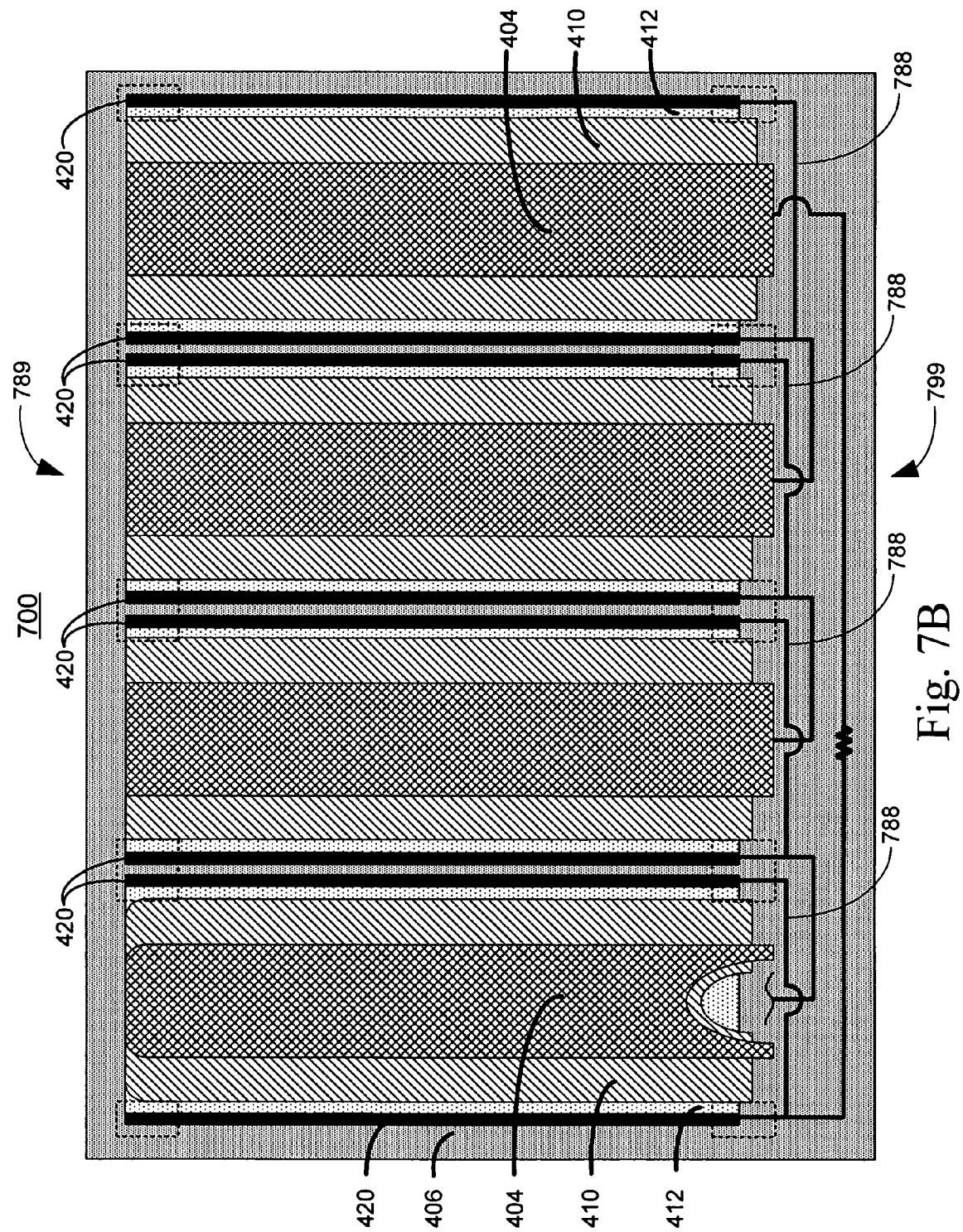
FIG. 7B is a cross-sectional view taken about line 7B—7B of FIG. 7A that depicts the serial arrangement of tubular solar cells in a bifacial assembly in accordance with an embodiment of the present invention.

FIG. 7B provides a cross-sectional view with respect to line 7B—7B of FIG. 7A. Solar cell 402 are electrically connected to other in series by arranging the solar cells such that they do not touch each other, as illustrated in FIGS. 7A and 7B and by the use of electrical contacts as described below in conjunction with FIG. 7B. The separation distance between solar cells 402 is any distance that prevents electrical contact between the TCO layers 412 of individual cells 402. For instance, in some embodiments, the distance between adjacent solar cells is 0.1 micron or greater, 0.5 microns or greater, or between 1 and 5 microns.

Referring to FIG. 7B, serial electrical contact between solar cells 402 is made by electrical contacts 788 that electrically connect the metal conductive core 404 of one elongated solar cell 402 to the corresponding counter-electrodes 120 of a different solar cell 402 as illustrated in FIG. 7B. FIG. 7B further illustrates a cutaway of metal conductive core 404 and semiconductor junction 410 in one solar cell 402 to further illustrate the architecture of the solar cells 402.

The solar cell assembly illustrated in FIG. 7 has several advantages. First, because of the positioning of counter-electrodes 420 and the transparency of both substrate 406 and covering 422, there is almost zero percent shading in the assembly. For instance, the assembly can receive direct sunlight from both face 733 and face 766. Second, in embodiments where a sealant such as EVA is used to laminate substrate 406 and covering 422 onto the plurality of solar cells, the structure is completely self-supporting. Still another advantage of the assembly is that is easy to manufacture. Unlike solar cells such as that depicted in FIG. 3A, no complicated grid or transparent conductive oxide on glass is needed. For example, to assemble a solar cell 402 and its corresponding counter-electrodes 420 together to complete the circuit illustrated in FIG. 7A, counter-electrode 420, when it is in the form of a wire, can be covered with conductive epoxy and dropped in the groove 777 of solar cell 402 and allowed to cure. As illustrated in FIG. 7B, conductive core 404, junction 410, and TCO 412 are flush with each other at end 789 of elongated solar cells 402. In contrast, at end 799 conductive core protrudes a bit with respect to junction 410 and TCO 412 as illustrated. Junction 410 also protrudes a bit at end 799 with respect to TCO 412. The protrusion of conductive core 404 at end 799 means that the sides of a terminal portion of the conductive core 404 are exposed (e.g., not covered by junction 410 and TCO 412). The purpose of this configuration is to reduce the chances of shorting counter-electrode 420 (or the epoxy used to mount the counter-electrode in groove 777) with TCO 412. In some embodiments, all or a portion of the exposed surface area of counter-electrodes 420 are shielded with an electrically insulating material in order to reduce the chances of electrical shortening. For example, in some embodiments, the exposed surface area of counter-electrodes 420 in the boxed regions of FIG. 7B is shielded with an electrically insulating material.

Still another advantage of the assembly illustrated in FIG. 7 is that the counter-electrode 420 can have much higher conductivity without shadowing. In other words, counter-electrode 420 can have a substantial cross-sectional size (e.g., 1 mm in diameter when solar cell 402 has a 6 mm diameter). Thus, counter-electrode 420 can carry a significant amount of current so that the wires can be as long as possible, thus enabling the fabrication of larger panels.

The series connections between solar cells 402 can be between pairs of solar cells 402 in the manner depicted in FIG. 7B. However, the invention is not so limited. In some embodiments, two or more solar cells 402 are grouped together (e.g., electrically connected in a parallel fashion) to form a group of solar cells and then such groups of solar cells are serially connected to each other. Therefore, the serial connections between solar cells can be between groups of solar cells where such groups have any number of solar cells 402 (e.g., 2, 3, 4, 5, 6, etc.). However, FIG. 7B illustrates a preferred embodiment in which each contact 788 serially connects only a pair of solar cells 402.

In some embodiments, there is a series insulator that runs lengthwise between each solar cell 402. In one example, this series insulator is a 0.001" thick sheet of transparent insulating plastic. In other examples this series insulator is a sheet of transparent insulating plastic having a thickness between 0.001" and 0.005". Alternatively, a round insulating clear plastic separator that runs lengthwise between solar cells 402 can be used to electrically isolate the solar cells 402. Advantageously, any light that does enter the small gap between solar cells 402 will be trapped and collected in the "double-divet" area formed by facing grooves 777 of adjacent solar cells 402.

Yet another embodiment of solar cell assembly 700 is that there is no extra absorption loss from a TCO or a metal grid on one side of the assembly. Further, assembly 700 has the same performance or absorber area exposed on both sides 733 and 766. This makes assembly 700 symmetrical.

Still another advantage of assembly 700 is that all electrical contacts 788 end at the same level (e.g., in the plane of line 7B—7B of FIG. 7A). As such, they are easier to connect and weld with very little substrate area wasted at the end. This simplifies construction of the solar cells 402 while at the same time serves to increase the overall efficiency of solar cell assembly 700. This increase in efficiency arises because the welds can be smaller. Smaller welds take up less of the electrically resistant transparent substrate 406 surface area that is otherwise occupied by solar cells 402.

Although not illustrated in FIG. 7, in some embodiments in accordance with FIG. 7, there is an intrinsic layer circumferentially disposed between the semiconductor junction 410 and the transparent conductive oxide 412 in an elongated solar cell 402 in the plurality of elongated solar cells 402. This intrinsic layer can be made of an undoped transparent oxide such as zinc oxide, indium-tin-oxide, or a combination thereof. In some embodiments, the semiconductor junction 410 of solar cells 402 in assembly 700 comprise an inner coaxial layer and an outer coaxial layer where the outer coaxial layer comprises a first conductivity type and the inner coaxial layer comprises a second, opposite, conductivity type. In an exemplary embodiment the inner coaxial layer comprises copper-indium-gallium-diselenide (CIGS) whereas the outer coaxial layer comprises CdS, SnO$_2$, ZnO, ZrO$_2$, or doped ZnO. In some embodiments not illustrated by FIG. 7, the conductive cores 404 in solar cells 402 are hollowed.

Figure 8:
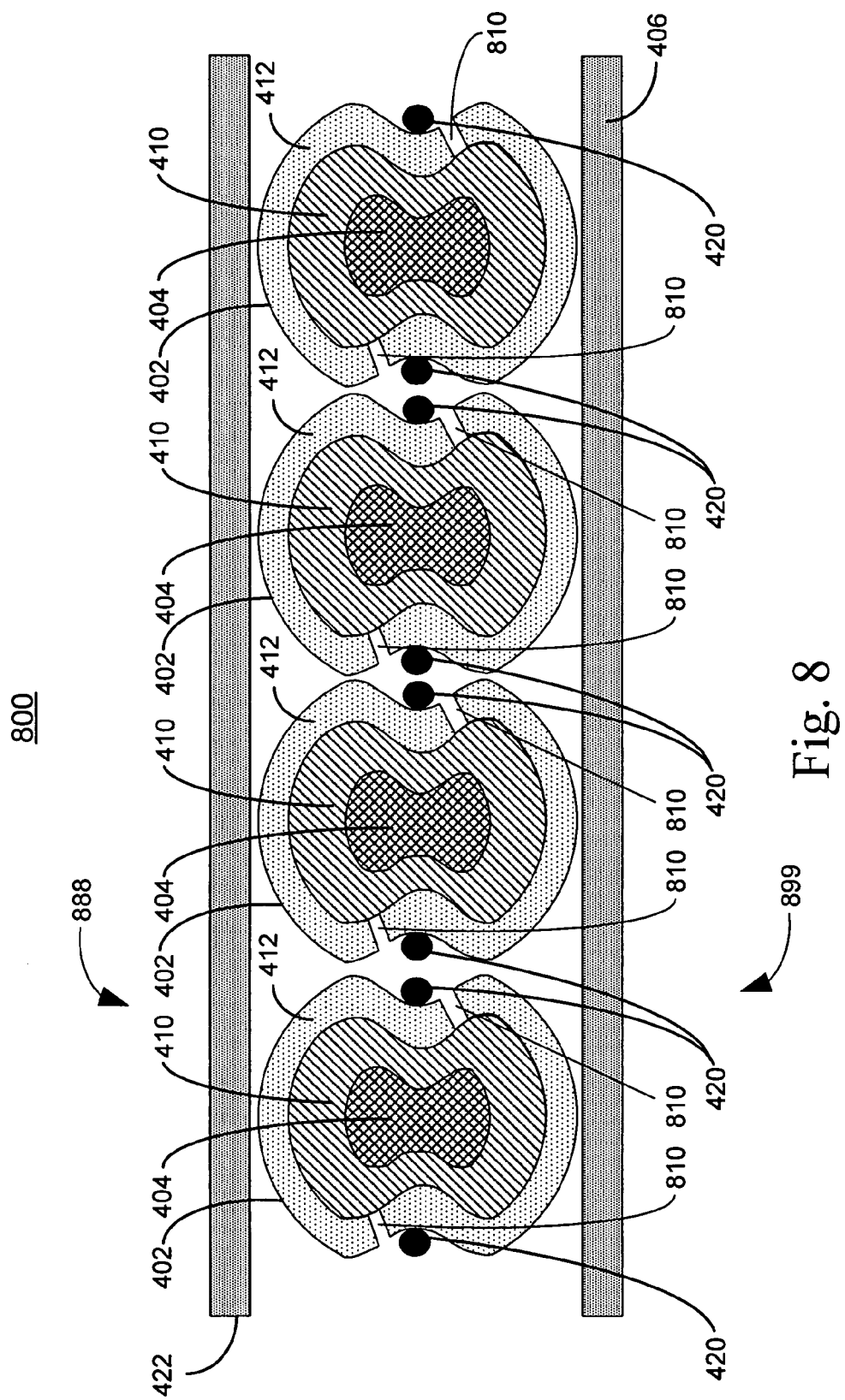
FIG. 8 is a cross-sectional view of elongated solar cells electrically arranged in series in a bifacial assembly where counter-electrodes abut individual solar cells and the outer TCO is cut, in accordance with another embodiment of the present invention.

FIG. 8 illustrates a solar cell assembly 800 of the present invention that is identical to solar cell assembly 700 of the present invention with the exception that TCO 412 is interrupted by breaks 810 that run along the long axis of solar cells 402 and cut completely through TCO 412. In the embodiment illustrated in FIG. 8, there are two breaks 810 that run the length of solar cell 402. The effect of such breaks 810 is that they electrically isolate the two counter-electrodes 420 associated with each solar cell 402 in solar cell assembly 800. There are many ways in which breaks 800 can be made. For example, a laser or an HCl etch can be used.

In some embodiments, not all elongated solar cells 402 in assembly 800 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

FIG. 9 illustrates a solar cell assembly 900 of the present invention in which conductive cores 402 are hollowed. In fact, conductive cores 402 can be hollowed in any of the embodiments of the present invention. One advantage of such a hollowed core 402 design is that it reduces the overall weight of the solar cell assembly. Core 402 is hollowed when there is a channel that extends lengthwise through all or a portion of core 402. In some embodiments, conductive core 402 is metal tubing.

In some embodiments, not all elongated solar cells 402 in assembly 900 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

Figure 10:
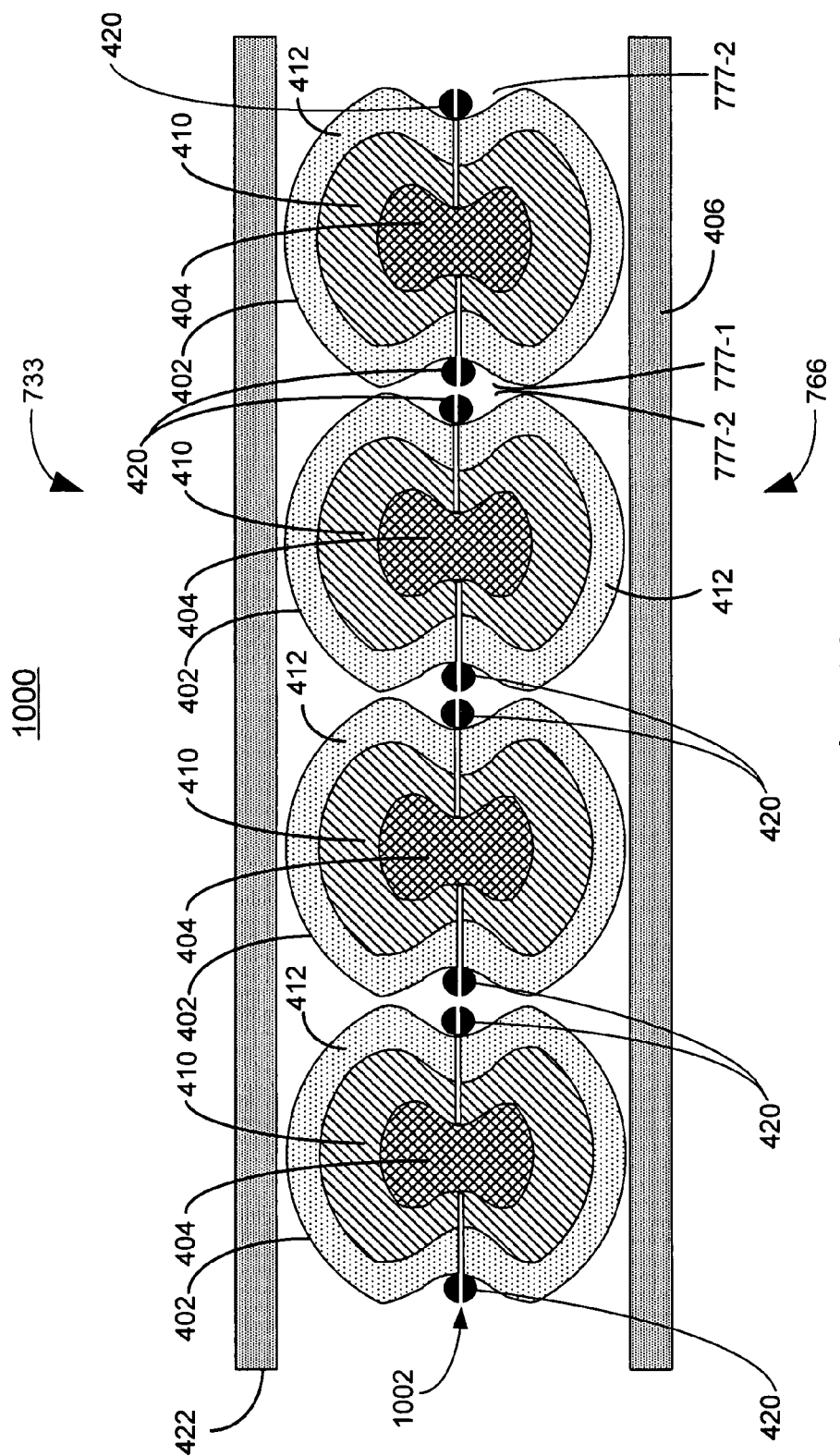
FIG. 10 is a cross-sectional view of elongated solar cells electrically arranged in series in a bifacial assembly in which a groove pierces the counter-electrodes, transparent conducting oxide layer, and junction layers of the solar cells, in accordance with an embodiment of the present invention.

FIG. 10 illustrates a solar cell assembly 1000 of the present invention in which counterelectrodes 420, TCOs 412, and junctions 410 are pierced, in the manner illustrated, in order to form two discrete junctions in parallel.

5.2 Exemplary Semiconductor Junctions

Figure 5A:
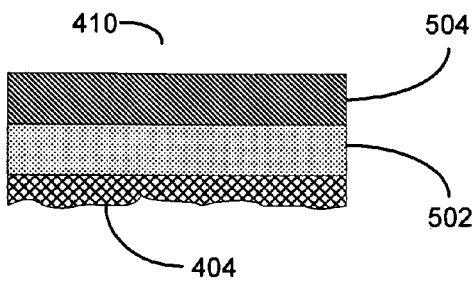
FIGS. 5A–5D depict semiconductor junctions that are used in various elongated solar cells in various embodiments of the present invention.

Referring to FIG. 5A, in one embodiment, semiconductor junction 410 is a heterojunction between an absorber layer 502, disposed on conductive core 404, and a junction partner layer 504, disposed on absorber layer 502. Layers 502 and 504 are composed of different semiconductors with different band gaps and electron affinities such that junction partner layer 504 has a larger band gap than absorber layer 502. In some embodiments, absorber layer 502 is p-doped and junction partner layer 504 is n-doped. In such embodiments, TCO layer 412 is n$^+$-doped. In alternative embodiments, absorber layer 502 is n-doped and junction partner layer 504 is p-doped. In such embodiments, TCO layer 412 is p$^+$-doped. In some embodiments, the semiconductors listed in Pandey, *Handbook of Semiconductor Electrodeposition*, Marcel Dekker Inc., 1996, Appendix 5, hereby incorporated by reference in its entirety, are used to form semiconductor junction 410.

5.2.1 Thin-Film Semiconductor Junctions Based on Copper Indium Diselenide and Other Type I-III-VI Materials Continuing to refer to FIG. 5A, in some embodiments, absorber layer 502 is a group I-III-VI$_2$ compound such as copper indium di-selenide (CuInSe$_2$; also known as CIS). In some embodiments, absorber layer 502 is a group I-III-VI$_2$ ternary compound selected from the group consisting of CdGeAs$_2$, ZnSnAs$_2$, CuInTe$_2$, AgInTe$_2$, CuInSe$_2$, CuGaTe$_2$, ZnGeAs$_2$, CdSnP$_2$, AgInSe$_2$, AgGaTe$_2$, CuInS$_2$, CdSiAs$_2$, ZnSnP$_2$, CdGeP$_2$, ZnSnAs$_2$, CuGaSe$_2$, AgGaSe$_2$, AgInS$_2$, ZnGeP$_2$, ZnSiAs$_2$, ZnSiP$_2$, CdSiP$_2$, or CuGaS$_2$ of either the p-type or the n-type when such compound is known to exist.

In some embodiments, junction partner layer 504 is CdS, ZnS, ZnSe, or CdZnS. In one embodiment, absorber layer 502 is p-type CIS and junction partner layer 504 is n-type CdS, ZnS, ZnSe, or CdZnS. Such semiconductor junctions 410 are described in Chapter 6 of Bube, *Photovoltaic Materials*, 1998, Imperial College Press, London, which is hereby incorporated by reference in its entirety.

In some embodiments, absorber layer 502 is copper-indium-gallium-diselenide (CIGS). In some embodiments, absorber layer 502 is copper-indium-gallium-diselenide (CIGS) and junction partner layer 504 is CdS, ZnS, ZnSe, or CdZnS. In some embodiments, absorber layer 502 is p-type CIGS and junction partner layer 504 is n-type CdS, ZnS, ZnSe, or CdZnS.

Figure 5B:
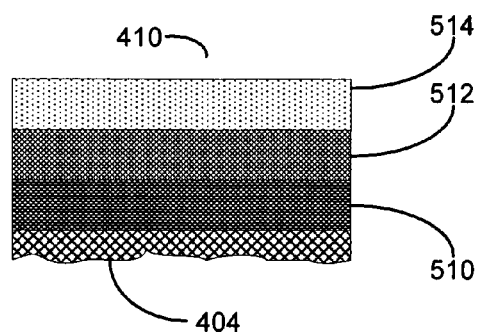
Figure 5C:
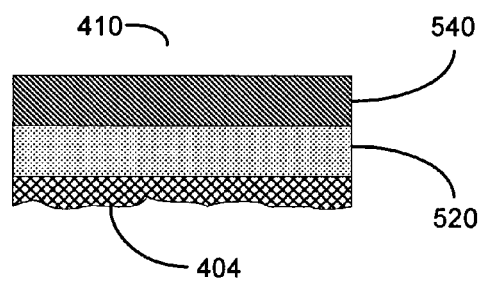
Figure 5D:
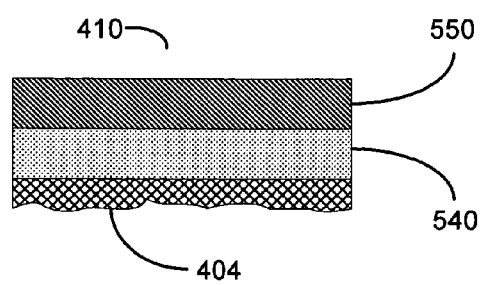

5.2.2 Semiconductor Junctions Based on Amorphous Silicon or Polycrystalline Silicon In some embodiments, referring to FIG. 5B, semiconductor junction 410 comprises amorphous silicon. In some embodiments this is an n/n type heterojunction. For example, in some embodiments, layer 514 comprises SnO$_2$ (Sb), layer 512 comprises undoped amorphous silicon, and layer 510 comprises n+ doped amorphous silicon.

In some embodiments, semiconductor junction 410 is a p-i-n type junction. For example, in some embodiments, layer 514 is p$^+$ doped amorphous silicon, layer 512 is undoped amorphous silicon, and layer 510 is n$^+$ amorphous silicon. Such semiconductor junctions 410 are described in Chapter 3 of Bube, *Photovoltaic Materials,* 1998, Imperial College Press, London, which is hereby incorporated by reference in its entirety.

In some embodiments of the present invention, semiconductor junction 410 is based upon thin-film polycrystalline. Referring to FIG. 5B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, *Silicon Solar Cells: Advanced Principles & Practice*, Centre for Photovoltaic Devices and Systems, University of New South Wales, Sydney, 1995; and Bube, *Photovoltaic Materials,* 1998, Imperial College Press, London, pp. 57–66, which is hereby incorporated by reference in its entirety.

In some embodiments of the present invention, semiconductor junctions 410 based upon p-type microcrystalline Si:H and microcrystalline Si:C:H in an amorphous Si:H solar cell are used. Such semiconductor junctions are described in Bube, *Photovoltaic Materials,* 1998, Imperial College Press, London, pp. 66–67, and the references cited therein, which is hereby incorporated by reference in its entirety.

5.2.3 Semiconductor Junctions Based on Gallium Arsenide and Other Type III-V Materials In some embodiments, semiconductor junctions 410 are based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 410 of the present invention are described in Chapter 4 of Bube, *Photovoltaic Materials,* 1998, Imperial College Press, London, which is hereby incorporated by reference in its entirety.

Furthermore, in some embodiments semiconductor junction 410 is a hybrid multijunction solars cells such as a GaAs/Si mechanically stacked multijunction as described by Gee and Virshup, 1988, *20th IEEE Photovoltaic Specialist Conference*, IEEE Publishing, New York, p. 754, which is hereby incorporated by reference in its entirety, a GaAs/CuInSe$_2$ MSMJ four-terminal device, consisting of a GaAs thin film top cell and a ZnCdS/CuInSe$_2$ thin bottom cell described by Stanbery et al., *19th IEEE Photovoltaic Specialist Conference*, IEEE Publishing, New York, p. 280, and Kim et al., *20th IEEE Photovoltaic Specialist Conference*, IEEE Publishing, New York, p. 1487, each of which is hereby incorporated by reference in its entirety. Other hybrid multijunction solar cells are described in Bube, *Photovoltaic Materials,* 1998, Imperial College Press, London, pp. 131–132, which is hereby incorporated by reference in its entirety.

5.2.4 Semiconductor Junctions Based on Cadmium Telluride and Other Type II-VI Materials In some embodiments, semiconductor junctions 410 are based upon II-VI compounds that can be prepared in either the n-type or the p-type form. Accordingly, in some embodiments, referring to FIG. 5C, semiconductor junction 410 is a p-n heterojunction in which layers 520 and 540 are any combination set forth in the following table or alloys thereof.

| Layer 520 | Layer 540 |
|---|---|
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 410 are based upon II-VI compounds are described in Chapter 4 of Bube, *Photovoltaic Materials,* 1998, Imperial College Press, London, which is hereby incorporated by reference in its entirety.

5.2.5 Semiconductor Junctions Based on Crystalline Silicon

While semiconductor junctions 410 that are made from thin semiconductor films are preferred, the invention is not so limited. In some embodiments semiconductor junctions 410 is based upon crystalline silicon. For example, referring to FIG. 5D, in some embodiments, semiconductor junction 410 comprises a layer of p-type crystalline silicon 540 and a layer of n-type crystalline silicon 550. Methods for manufacturing crystalline silicon semiconductor junctions 410 are described in Chapter 2 of Bube, *Photovoltaic Materials,* 1998, Imperial College Press, London, which is hereby incorporated by reference in its entirety.

5.3 Albedo Embodiments

The solar cell assemblies of the present invention are advantageous because they can collect light through either of their two faces. Accordingly, in some embodiments of the present invention, theses bifacial solar cell assemblies (e.g., solar cell assembly 400, 600, 700, 800, 900, etc.) are arranged in a reflective environment in which surfaces around the solar cell assembly have some amount of albedo. Albedo is a measure of reflectivity of a surface or body. It is the ratio of electromagnetic radiation (EM radiation) reflected to the amount incident upon it. This fraction is usually expressed as a percentage from 0% to 100%. In some embodiments, surfaces in the vicinity of the solar cell assemblies of the present invention are prepared so that they have a high albedo by painting such surfaces a reflective white color. In some embodiments, other materials that have a high albedo can be used. For example, the albedo of some materials around such solar cells approach or exceed ninety percent. See, for example, Boer, 1977, Solar Energy 19, 525, which is hereby incorporated by reference in its entirety. However, surfaces having any amount of albedo (e.g., five percent or more, ten percent or more, twenty percent or more) are within the scope of the present invention. In one embodiment, the solar cells assemblies of the present invention are arranged in rows above a gravel surface, where the gravel has been painted white in order to improve the reflective properties of the gravel.

In some embodiments, the bifacial solar cell assemblies of the present invention are placed in a manner such that one surface (e.g., face 633 of solar cell assembly 600) is illuminated in a way similar to a conventional flat-panel solar cell panel. For example, it is installed facing South (in the northern hemisphere) with an angle of inclination that is latitude dependent (e.g., in general is not very different from the latitude). The opposing surface of the bifacial solar cell assembly (e.g., face 655 of solar cell assembly 600) of the present invention receives a substantial amount of diffuse light reflected from the ground and neighboring walls in the vicinity of the solar cell assembly.

By way of example, in some embodiments of the present invention, the bifacial solar cell assemblies (panels) of the present invention have a first and second face and are placed in rows facing South in the Northern hemisphere (or facing North in the Southern hemisphere). Each of the panels is placed some distance above the ground (e.g., 100 cm above the ground). The East-West separation between the panels is somewhat dependent upon the overall dimensions of the panels. By way of illustration only, panels having overall dimensions of about 106 cm×44 cm are placed in the rows such that the East-West separation between the panels is between 10 cm and 50 cm. In one specific example the East-West separation between the panels is 25 cm.

In some embodiments, the central point of the panels in the rows of panels is between 0.5 meters and 2.5 meters from the ground. In one specific example, the central point of the panels is 1.55 meters from the ground. The North-South separation between the rows of panels is dependent on the dimensions of the panels. By way of illustration, in one specific example, in which the panels have overall dimensions of about 106 cm×44 cm, the North-South separation is 2.8 meters. In some embodiments, the North-South separation is between 0.5 meters and 5 meters. In some embodiments, the North-South separation is between 1 meter and 3 meters.

In some embodiments of the present invention, the panels in the rows are each tilted with respect to the ground in order to maximize the total amount of light received by the panels. There is some tradeoff between increasing the amount of light received by one face versus the amount of light received on the opposing face as a function of tilt angle. However, at certain tilt angles, the total amount of light received by the panels, where total amount of light is defined as the sum of direct light received on the first and second face of the bifacial panel, is maximized. In some embodiments, the panels in the rows of panels are each tilted between five degrees and forty-five degrees from the horizontal. In some embodiments, the panels of the present invention are tilted between fifteen degrees and forty degrees from the horizontal. In some embodiments, the panels of the present invention are tilted between twenty-five degrees and thirty-five degrees from the horizontal. In one specific embodiment, the panels of the present invention are tilted thirty degrees from the horizontal.

In some embodiments, models for computing the amount of sunlight received by solar panels as put forth in Lorenzo et al., 1985, Solar Cells 13, pp. 277–292, which is hereby incorporated by reference in its entirety, are used to compute the optimum horizontal tilt and East-West separation of the solar panels in the rows of solar panels that are placed in a reflective environment.

5.4 Dual Layer Core Embodiments

Embodiments of the present invention in which conductive core 404 of the solar cells 402 of the present invention is made of a uniform conductive material have been disclosed. The invention is not limited to these embodiments.

In some embodiments, conductive core 404 in fact has an inner core and an outer conductive core. The outer conductive core is circumferentially disposed on the inner core. In such embodiments, the inner core is typically nonconductive whereas the outer core is conductive. The inner core has an elongated shape consistent with other embodiments of the present invention. For instance, in one embodiment, the inner core is made of glass fibers in the form of a wire. In some embodiments, the inner core is an electrically conductive nonmetallic material. However, the present invention is not limited to embodiments in which the inner core is electrically conductive because the outer core can function as the electrode. In some embodiments, the inner core is tubing (e.g., plastic tubing).

In some embodiments, the inner core is made of a material such as polybenzamidazole (e.g., Celazole®, available from Boedeker Plastics, Inc., Shiner, Tex.). In some embodiments, the inner core is made of polymide (e.g., DuPont™ Vespel®, or DuPont™ Kapton®, Wilmington, Del.). In some embodiments, the inner core is made of polytetrafluoroethylene (PTFE) or polyetheretherketone (PEEK), each of which is available from Boedeker Plastics, Inc. In some embodiments, the inner core is made of polyamide-imide (e.g., Torlon® PAI, Solvay Advanced Polymers, Alpharetta, Ga.).

In some embodiments, the inner core is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the inner core is a phenoloic laminate having a NEMA grade of G-3, G-5, G-7, G-9, G-10 or G-11. Exemplary phenolic laminates are available from Boedeker Plastics, Inc.

In some embodiments, the inner core is made of polystyrene. Examples of polystyrene include general purpose polystyrene and high impact polystyrene as detailed in Marks' Standard Handbook for Mechanical Engineers, ninth edition, 1987, McGraw-Hill, Inc., p. 6–174, which is hereby incorporated by reference in its entirety. In still other embodiments, inner core is made of cross-linked polystyrene. One example of cross-linked polystyrene is Rexolite® (available from San Diego Plastics Inc., National City, Calif.). Rexolite is a thermoset, in particular a rigid and translucent plastic produced by cross linking polystyrene with divinylbenzene.

In some embodiments, the inner core is a polyester wire (e.g., a Mylar® wire). Mylar® is available from DuPont Teijin Films (Wilmington, Del.). In still other embodiments, the inner core is made of Durastone®, which is made by using polyester, vinylester, epoxid and modified epoxy resins combined with glass fibers (Roechling Engineering Plastic Pte Ltd. (Singapore).

In still other embodiments, the inner core is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are Zelux® M and Zelux® W, which are available from Boedeker Plastics, Inc.

In some embodiments, the inner core is made of polyethylene. In some embodiments, inner core is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6–173, which is hereby incorporated by reference in its entirety. In some embodiments, the inner core is made of acrylonitrile-butadiene-styrene, polytetrfluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6–172 through 6–175, which is hereby incorporated by reference in its entirety.

Additional exemplary materials that can be used to form the inner core are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), *Plastics*, Morgan-Grampiand, Ltd., 2 vols. 1970; Tobolsky and Mark (eds.), *Polymer Science and Materials*, Wiley, 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference in its entirety.

In general, outer core is made out of any material that can support the photovoltaic current generated by solar cell with negligible resistive losses. In some embodiments, outer core is made of any conductive metal, such as aluminum, molybdenum, steel, nickel, silver, gold, or an alloy thereof. In some embodiments, outer core is made out of a metal-, graphite-, carbon black-, or superconductive carbon black-filled oxide, epoxy, glass, or plastic. In some embodiments, outer core is made of a conductive plastic. In some embodiments, this conductive plastic is inherently conductive without any requirement for a filler.

In embodiments where an inner core and an outer core is present, semiconductor junction 410 and TCO 412 are stripped from the inner core at a terminal end of the solar cell where an electrical contact serially joins the solar cell to another solar cell. For example, in some embodiments, the semiconductor junction 410 and TCO are stripped in the manner illustrated in FIGS. 4D, 4F, 6B, 6C, and 7B.

5.5 Exemplary Dimensions

The present invention encompasses solar cell assemblies having any dimensions that fall within a broad range of dimensions. For example, referring to FIG. 4B, the present invention encompasses solar cell assemblies having a length l between 1 cm and 50,000 cm and a width w between 1 cm and 50,000 cm. In some embodiments, the solar cell assemblies have a length l between 10 cm and 1,000 cm and a width w between 10 cm and 1,000 cm. In some embodiments, the solar cell assemblies have a length l between 40 cm and 500 cm and a width w between 40 cm and 500 cm.

5.6 Solar Cells Manufactured Using a Roll Method or Having an Inner TCO

In some embodiments, copper-indium-gallium-diselenide (Cu(InGa)Se$_2$), referred to herein as CIGS, is used to make the absorber layer of junction 110. In such embodiments, conductive core 404 can be made of molybdenum. In some embodiments, core 404 comprises an inner core of polyimide and an outer core that is a thin film of molybdenum sputtered onto the polyimide core prior to CIGS deposition. On top of the molybdenum, the CIGS film, which absorbs the light, is evaporated. Cadmium sulfide (CdS) is then deposited on the CIGS in order to complete semiconductor junction 410. Optionally, a thin intrinsic layer (i-layer) is then deposited on the semiconductor junction 410. The i-layer can be formed using any undoped transparent oxide including, but not limited to, zinc oxide or indium-tin-oxide. Next, TCO 412 is disposed on either the i-layer (when present) or the semiconductor junction 410 (when the i-layer is not present). TCO can be made of a material such as aluminum doped zinc oxide (ZnO:Al).

ITN Energy Systems, Inc., Global Solar Energy, Inc., and the Institute of Energy Conversion (IEC), have collaboratively developed technology for manufacturing CIGS photovoltaics on polyimide substrates using a roll-to-roll co-evaporation process for deposition of the CIGS layer. In this process, a roll of molybdenum-coated polyimide film (referred to as the web) is unrolled and moved continuously into and through one or more deposition zones. In the deposition zones, the web is heated to temperatures of up to ~450° C. and copper, indium, and gallium are evaporated onto it in the presence of selenium vapor. After passing out of the deposition zone(s), the web cools and is wound onto a take-up spool. See, for example, 2003, Jensen et al., "Back Contact Cracking During Fabrication of CIGS Solar Cells on Polyimide Substrates," NCPV and Solar Program Review Meeting 2003, NREL/CD-520-33586, pages 877–881, which is hereby incorporated by reference in its entirety. Likewise, Birkmire et al., 2005, Progress in Photovoltaics: Research and Applications 13, 141–148, hereby incorporated by reference, disclose a polyimide/Mo web structure, specifically, PI/Mo/Cu(InGa)Se$_2$/CdS/ZnO/ITO/Ni—Al. Deposition of similar structures on stainless foil has also been explored. See, for example, Simpson et al., 2004, "Manufacturing Process Advancements for Flexible CIGS PV on Stainless Foil," DOE Solar Energy Technologies Program Review Meeting, PV Manufacturing Research and Development, P032, which is hereby incorporated by reference in its entirety.

In some embodiments of the present invention, an absorber material is deposited onto a polyimide/molybdenum web, such as those developed by Global Solar Energy (Tucson, Ariz.), or a metal foil (e.g., the foil disclosed in Simpson et al.). In some embodiments, the absorber material is any of the absorbers disclosed herein. In a particular embodiment, the absorber is Cu(InGa)Se$_2$. In some embodiments, the elongated core is made of a nonconductive material such as undoped plastic. In some embodiments, the elongated core is made of a conductive material such as a conductive metal, a metal-filled epoxy, glass, or resin, or a conductive plastic (e.g., a plastic containing a conducting filler). Next, the semiconductor junction 410 is completed by depositing a window layer onto the absorber layer. In the case where the absorber layer is Cu(InGa)Se$_2$, CdS can be used. Finally, an optional i-layer 415 and TCO 412 are added to complete the solar cell. Next, the foil is wrapped around and/or glued to a wire-shaped or tube-shaped elongated core. The advantage of such a fabrication method is that material that cannot withstand the deposition temperature of the absorber layer, window layer, i-layer or TCO layer can be used as an inner core for the solar cell. This manufacturing process can be used to manufacture any of the solar cells 402 disclosed in the present invention, where the conductive core 402 comprises an inner core and an outer conductive core. The inner core is any conductive or nonconductive material disclosed herein whereas the outer conductive core is the web or foil onto which the absorber layer, window layer, and TCO were deposited prior to rolling the foil onto the inner core. In some embodiments, the web or foil is glued onto the inner core using appropriate glue.

An aspect of the present invention provides a method of manufacturing a solar cell comprising depositing an absorber layer on a first face of a metallic web or a conducting foil. Next a window layer is deposited on to the absorber layer. Next a transparent conductive oxide layer is deposited on to the window layer. The metallic web or conducting foil is then rolled around an elongated core, thereby forming an elongated solar cell 402. In some embodiments, the absorber layer is copper-indium-gallium-diselenide ($Cu(InGa)Se_2$) and the window layer is cadmium sulfide. In some embodiments, the metallic web is a polyimide/molybdenum web. In some embodiments, the conducting foil is steel foil or aluminum foil. In some embodiments, the elongated core is made of a conductive metal, a metal-filled epoxy, a metal-filled glass, a metal-filled resin, or a conductive plastic.

In some embodiments, a transparent conducting oxide is deposited on a wire-shaped or tube-shaped elongated core rather than wrapping a metal web or foil around the elongated core. In such embodiments, the wire-shaped or tube-shaped elongated core can be, for example, a plastic rod, a glass rod, a glass tube, or a plastic tube. Such embodiments require some form of conductor in electrical communication with the interior face of the semiconductor junction. In some embodiments, divits in the wire-shaped or tube-shaped elongated core are filled with a conductive metal in order to provide such a conductor. The conductor can be inserted in the divits prior to depositing the transparent conductive oxide onto the wire-shaped or tube-shaped elongated core.

More specific embodiments will now be disclosed. In some embodiments the elongated core is a glass tubing having a divet that runs lengthwise on the outer surface of the glass tubing, and the manufacturing method comprises depositing a conductor in the divit prior to the rolling step. In some embodiments the glass tubing has a second divit that runs lengthwise on the surface of the glass tubing. In such embodiments, the first divit and the second divit are on approximate or exact opposite circumferential sides of the glass tubing. In such embodiments, accordingly, the method further comprises depositing a conductor in the second divit prior to the rolling or, in embodiments in which rolling is not used, prior to the deposition of an inner TCO, junction, and outer TCO onto the elongated core.

In some embodiments the elongated core is a glass rod having a first divet that runs lengthwise on the surface of the glass rod and the method comprises depositing a conductor in the first divit prior to the rolling. In some embodiments the glass rod has a second divit that runs lengthwise on the surface of the glass rod and the first divit and the second divit are on approximate or exact opposite circumferential sides of the glass rod. In such embodiments, accordingly, the method further comprises depositing a conductor in the second divit prior to the rolling or, in embodiments in which rolling is not used, prior to the deposition of an inner TCO, junction, and outer TCO onto the elongated core. Suitable materials for the conductor are any of the materials described as a conductor herein including, but not limited to, aluminum, molybdenum, steel, nickel, silver, gold, or an alloy thereof.

Figure 13:
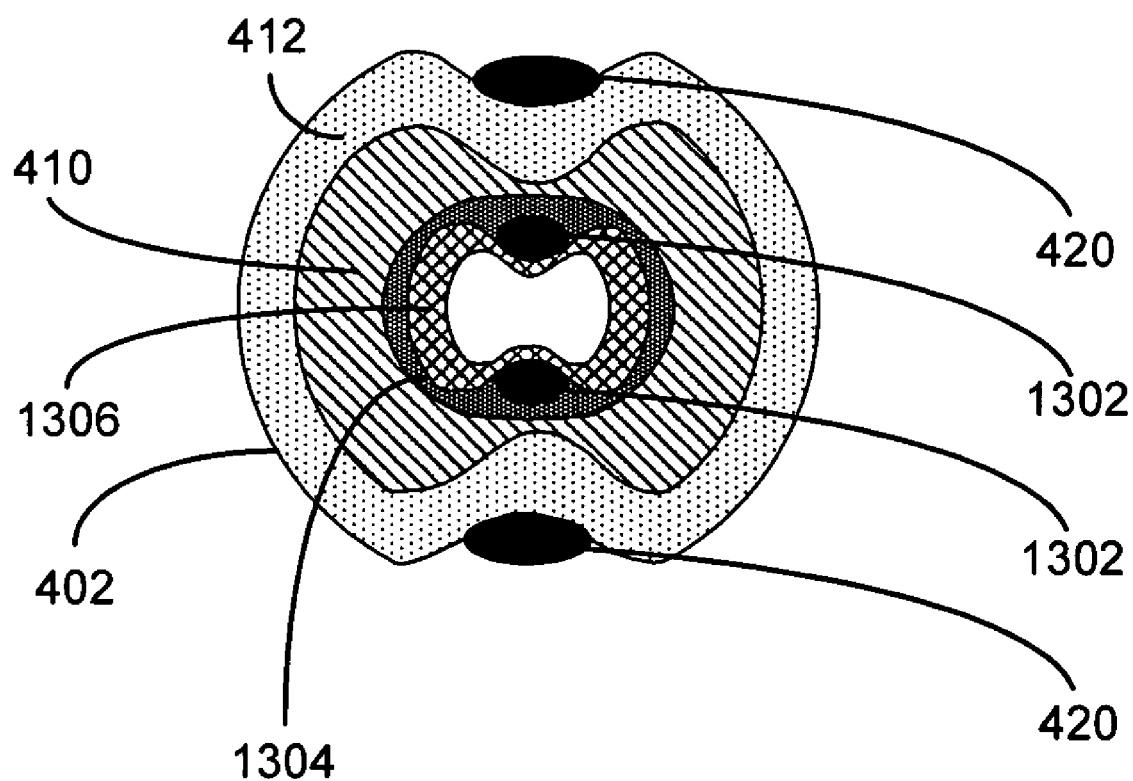
FIG. 13 illustrates a solar cell made by a roll method in accordance with an embodiment of the present invention.

FIG. 13 details a cross-section of a solar cell 402 in accordance with the present invention. The solar cell 402 can be manufactured using either the rolling method or deposition techniques. Components that have reference numerals corresponding to other embodiments of the present invention (e.g., 410, 412, and 420) are made of the same materials disclosed in such embodiments. In FIG. 13, there is an elongated tubing 1306 having a first and second divit running lengthwise along the tubing (perpendicular to the plane of the page) that are on circumferentially opposing sides of tubing 1306 as illustrated. In typical embodiments, tubing 1306 is not conductive. For example, tubing 1306 is made of plastic or glass in some embodiments. Conductive wiring 1302 is placed in the first and second divit as illustrated in FIG. 13. In some embodiments the conductive wiring is made of any of the conductive materials of the present invention. In some embodiments, conductive wiring 1302 is made out of aluminum, molybdenum, steel, nickel, silver, gold, or an alloy thereof. In embodiments where 1304 is a conducting foil or metallic web, the conductive wiring 1302 is inserted into the divits prior to wrapping the metallic web or conducting foil 1304 around the elongated core 1306. In embodiments where 1304 is a transparent conductive oxide, the conductive wiring 1302 is inserted into the divits prior to depositing the transparent conductive oxide 1304 onto elongated core 1306. As noted, in some embodiments the metallic web or conducting foil 1304 is wrapped around tubing 1306. In some embodiments, metallic web or conducting foil 1304 is glued to tubing 1306. In some embodiments layer 1304 is not a metallic web or conducting foil. For instance, in some embodiments, layer 1304 is a transparent conductive oxide (TCO). Such a layer is advantageous because it allows for thinner absorption layers in the semiconductor junction. In embodiments where layer 1304 is a TCO, the TCO, semiconductor junction 410 and outer TCO 412 are deposited using deposition techniques.

One aspect of the invention provides a solar cell assembly comprising a plurality of elongated solar cells 402 each having the structure disclosed in FIG. 13. That is, each elongated solar cell 402 in the plurality of elongated solar cells comprises an elongated tubing 1306, a metallic web or a conducting foil (or, alternatively, a layer of TCO) 1304 circumferentially disposed on the elongated tubing 1306, a semiconductor junction 410 circumferentially disposed on the metallic web or the conducting foil (or, alternatively, a layer of TCO) 1304 and a transparent conductive oxide layer 412 disposed on the semiconductor junction 410. The elongated solar cells 402 in the plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly further comprises a plurality of metal counter-electrodes. Each respective elongated solar cell 402 in the plurality of elongated solar cells is bound to a first corresponding metal counter-electrode 420 in the plurality of metal counter-electrodes such that the first metal counter-electrode lies in a first groove that runs lengthwise on the respective elongated solar cell 402. The apparatus further comprises a transparent electrically insulating substrate that covers all or a portion of said the face of the planar array. A first and second elongated solar cell in the plurality of elongated solar cells are electrically connected in series by an electrical contact that connects the first electrode of the first elongated solar cell to the first corresponding counter-electrode of the second elongated solar cell. In some embodiments, the elongated tubing 1306 is glass tubing or plastic tubing having a one or more grooves filled with a conductor 1302. In some embodiments, each respective elongated solar cell 402 in the plurality of elongated solar cells is bound to a second corresponding metal counter-electrode 420 in the plurality of metal counter-electrodes such that the second metal counter-electrode lies in a second groove that runs lengthwise on the respective elongated solar cell 402 and such that the first groove and the second groove are on opposite or substantially opposite circumferential sides of the respective elongated solar cell 402. In some embodiments, the plurality of elongated solar cells 402 is configured to receive direct light from the first face and said second face of the planar array.

5.7 Static Concentrators

Figure 11:
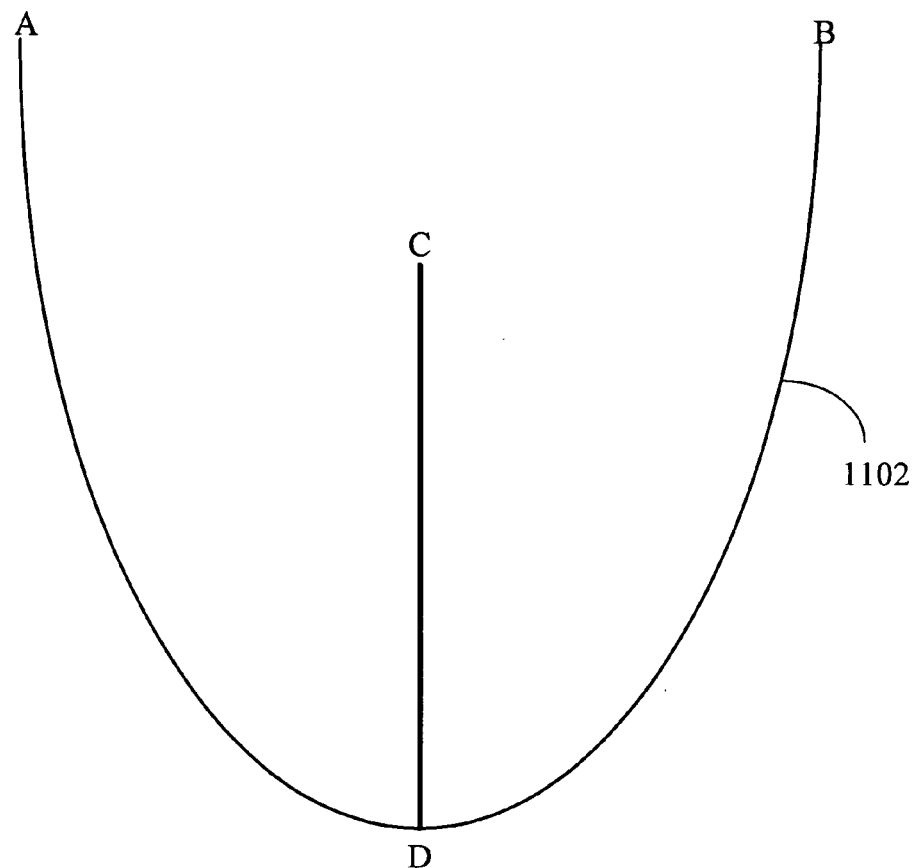
FIG. 11 illustrates how the solar cell assemblies of the present invention can be used in conjunction with one type of static concentrator.

In some embodiments, static concentrators are used to improve the performance of the solar cell assemblies of the present invention. The use of a static concentrator in one exemplary embodiment is illustrated in FIG. 11, where static concentrator 1102, with aperture AB, is used to increase the efficiency of bifacial solar cell assembly CD, where solar cell assembly CD is any of 400 (FIG. 4), 600 (FIG. 6), 700 (FIG. 7), 800 (FIG. 8), 900 (FIG. 9), or 1000 (FIG. 10). Static concentrator 1102 can be formed from any static concentrator materials known in the art such as, for example, a simple, properly bent or molded aluminum sheet, or reflector film on polyurethane. Concentrator 1102 is an example of a low concentration ratio, nonimaging, compound parabolic concentrator (CPC)-type collector. Any (CPC)-type collector can be used with the solar cell assemblies of the present invention. For more information on (CPC)-type collectors, see Pereira and Gordon, 1989, Journal of Solar Energy Engineering, 111, pp. 111–116, which is hereby incorporated by reference in its entirety.

Additional static concentrators that can be used with the present invention are disclosed in Uematsu et al., 1999, Proceedings of the 11$^{th}$ International Photovoltaic Science and Engineering Conference, Sapporo, Japan, pp. 957–958; Uematsu et al., 1998, Proceedings of the Second World Conference on Photovoltaic Solar Energy Conversion, Vienna, Austria, pp. 1570–1573; Warabisako et al., 1998, Proceedings of the Second World Conference on Photovoltaic Solar Energy Conversion, Vienna, Austria, pp. 1226–1231; Eames et al., 1998, Proceedings of the Second World Conference on Photovoltaic Solar Energy Conversion, Vienna Austria, pp. 2206–2209; Bowden et al., 1993, Proceedings of the 23$^{rd}$ IEEE Photovoltaic Specialists Conference, pp. 1068–1072; and Parada et al., 1991, Proceedings of the 10$^{th}$ EC Photovoltaic Solar Energy Conference, pp. 975–978, each of which is hereby incorporated by reference in its entirety.

Figure 12:
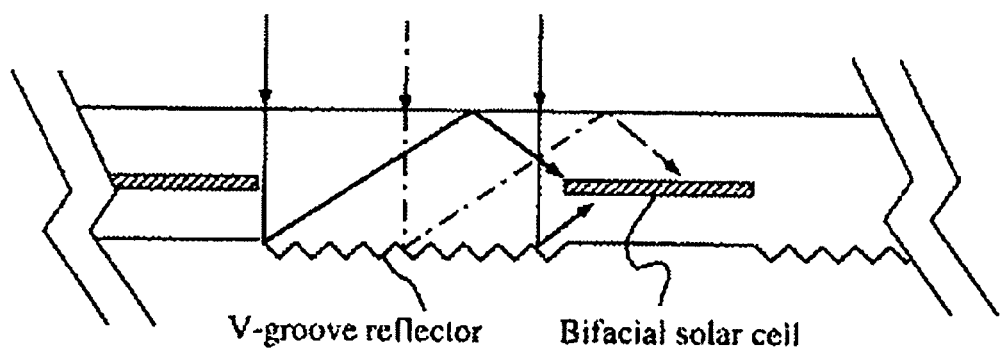
FIG. 12 illustrates how the solar cell assemblies of the present invention can be used in conjunction with another type of static concentrator.

In some embodiments, a static concentrator as illustrated in FIG. 12 is used. The bifacial solar cells illustrated in FIG. 12 can be any of the bifacial solar cell assemblies of the present invention, including but not limited to assembly 400 (FIG. 4), 600 (FIG. 6), 700 (FIG. 7), 800 (FIG. 8), 900 (FIG. 9), or 1000 (FIG. 10). The static concentrator uses two sheets of cover glass on the front and rear of the module with submillimeter V-grooves that are designed to capture and reflect incident light as illustrated in the Figure. More details of such concentrators is found in Uematsu et al., 2001, Solar Energy Materials & Solar Cell 67, 425–434 and Uematsu et al., 2001, Solar Energy Materials & Solar Cell 67, 441–448, each of which is hereby incorporated by reference in its entirety.

7. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. For example, in some embodiments the TCO 412 is circumferentially coated with an antireflective coating. In some embodiments, this antireflective coating is made of $MgF_2$. The specific embodiments described herein are offered by way of example only, and the invention is to be limited only by the terms of the appended claims, along with the full scope of equivalents to which such claims are entitled.

What is claimed is:

1. A solar cell assembly comprising:
   (A) a plurality of elongated solar cells, each elongated solar cell in said plurality of elongated solar cells comprising:
      an elongated conductive core configured as a first electrode;
      a semiconductor junction circumferentially disposed on said elongated conductive core; and
      a transparent conductive oxide layer disposed on said semiconductor junction;
      wherein elongated solar cells in said plurality of elongated solar cells are arranged in a parallel or a near parallel manner thereby forming a planar array having a first face and a second face, wherein the plurality of elongated solar cells are arranged such that one or more elongated solar cells in said plurality of elongated solar cells do not contact adjacent elongated solar cells;
   (B) a plurality of metal counter-electrodes, wherein each respective elongated solar cell in said plurality of elongated solar cells is bound to a first corresponding metal counter-electrode in said plurality of metal counter-electrodes such that the first metal counter-electrode lies in a first groove that is formed in the surface of and runs lengthwise on the respective elongated solar cell; and
   (C) a transparent electrically insulating substrate that covers all or a portion of said first face of said planar array; wherein
   a first and second elongated solar cell in said plurality of elongated solar cells are electrically connected in series by an electrical contact that connects the first electrode of the first elongated solar cell to the first corresponding counter-electrode of the second elongated solar cell; and
   said solar cell assembly is configured to receive direct light from a side of said solar cell assembly that includes said first face of said planar array and a side of said solar cell assembly that includes said second face of said planar array.

2. The solar cell assembly of claim 1, wherein each respective elongated solar cell in said plurality of elongated solar cells is bound to a second corresponding metal counter-electrode in said plurality of metal counter-electrodes such that the second metal counter-electrode lies in a second groove that runs lengthwise on the respective elongated solar cell and wherein said first groove and said second groove are on opposite or substantially opposite sides of said respective elongated solar cell.

3. The solar cell assembly of claim 2, wherein said electrical contact connects the first electrode of the first elongated solar cell to the first corresponding and the second corresponding counter-electrode of the second elongated solar cell.

4. The solar cell assembly of claim 1, further comprising:
(D) a transparent insulating covering disposed on said second face of said planar array, thereby encasing said plurality of elongated solar cells between said transparent insulating covering and said transparent electrically insulating substrate.

5. The solar cell assembly of claim 4, wherein said transparent insulating covering and said transparent insulating substrate are bonded together by a sealant.

6. The solar cell assembly of claim 5, wherein said sealant is ethylene vinyl acetate.

7. The solar cell assembly of claim 1, wherein said semiconductor junction is a homojunction, a heterojunction, a heteroface junction, a buried homojunction, or a p-i-n junction.

8. The solar cell assembly of claim 1, wherein there is an intrinsic layer disposed between said semiconductor junction and said transparent conductive oxide in an elongated solar cell in said plurality of elongated solar cells.

9. The solar cell assembly of claim 8, wherein the intrinsic layer is formed by an undoped transparent oxide.

10. The solar cell assembly of claim 8, wherein the intrinsic layer is made of zinc oxide, indium-tin-oxide, or a combination thereof.

11. The solar cell assembly of claim 1, wherein the semiconductor junction comprises:
an inner coaxial layer; and
an outer coaxial layer,
wherein said outer coaxial layer comprises a first conductivity type and said inner coaxial layer comprises a second, opposite, conductivity type.

12. The solar cell assembly of claim 11, wherein said inner coaxial layer comprises copper-indium-gallium-diselenide (CIGS).

13. The solar cell assembly of claim 11, wherein said outer coaxial layer comprises CdS, $SnO_2$, ZnO, $ZrO_2$, or doped ZnO.

14. The solar cell assembly of claim 1, wherein said elongated conductive core is made of aluminum, molybdenum, steel, nickel, silver, gold, an alloy thereof, or any combination thereof.

15. The solar cell assembly of claim 1, wherein said transparent conductive oxide layer is made of tin oxide $SnO_x$, with or without fluorine doping, indium-tin oxide (ITO), zinc oxide (ZnO) or a combination thereof.

16. The solar cell assembly of claim 1, wherein said transparent insulating substrate comprises glass or Tedlar.

17. The solar cell assembly of claim 1, wherein there is ethylene vinyl acetate between said plurality of elongated solar cells and said transparent electrically insulating substrate.

18. The solar cell assembly of claim 1, wherein said elongated conductive core is hollowed.

19. The solar cell assembly of claim 1, wherein an elongated solar cell in said plurality of elongated solar cells is rod-shaped.

20. The solar cell assembly of claim 1, wherein said elongated conductive core is metal tubing.

21. The solar cell assembly of claim 1, wherein two or more elongated solar cells in said plurality of elongated solar cells are electrically connected in parallel.

22. The solar cell assembly of claim 1, wherein an elongated solar cell in said plurality of elongated solar cells further comprises an antireflective coating that is circumferentially disposed on said transparent conductive oxide layer.

23. The solar cell assembly of claim 22, wherein said antireflective coating is made of $MgF_2$.

24. The solar cell assembly of claim 1, wherein said elongated conductive core comprises:
an inner core made of a nonmetallic material; and
a conductive outer core circumferentially disposed on said inner core.

25. The solar cell assembly of claim 24, wherein said inner core is tubing.

26. The solar cell assembly of claim 24, wherein said inner core is made of polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

27. A plurality of solar cell assemblies, each solar cell assembly in the plurality of solar cells assemblies having the structure of the solar cell assembly of claim 1, wherein solar cell assemblies in said plurality of solar assemblies are arranged in rows on a surface having an albedo that exceeds 10%.

28. A plurality of solar cell assemblies, each solar cell assembly in the plurality of solar cells assemblies having the structure of the solar cell assembly of claim 1, wherein solar cell assemblies in said plurality of solar assemblies are arranged in rows on a surface having an albedo that exceeds 20%.

29. A plurality of solar cell assemblies, each solar cell assembly in the plurality of solar cells assemblies having the structure of the solar cell assembly of claim 1, wherein solar cell assemblies in said plurality of solar assemblies are arranged in rows on a surface having an albedo that exceeds 40%.

30. A plurality of solar cell assemblies, each solar cell assembly in the plurality of solar cells assemblies having the structure of the solar cell assembly of claim 1, wherein solar cell assemblies in said plurality of solar assemblies are arranged in rows on a surface that is painted white.

31. A plurality of solar cell assemblies, each solar cell assembly in the plurality of solar cells assemblies having the structure of the solar cell assembly of claim 1, wherein
solar cell assemblies in said plurality of solar assemblies are arranged in rows; the first face of each planar array in each solar cell assembly in said plurality of solar cell assemblies is directed South; and
solar cell assemblies in said plurality of solar assemblies have an angle of inclination with respect to the horizontal that is between five degrees and forty-five degrees.

32. The plurality of solar cell assemblies of claim 31, wherein solar cell assemblies in said plurality of solar assemblies have an angle of inclination with respect to the horizontal that is between fifteen degrees and forty degrees.

33. The plurality of solar cell assemblies of claim 31, wherein solar cell assemblies in said plurality of solar assemblies have an angle of inclination with respect to the horizontal that is between twenty-five degrees and thirty-five degrees.

34. The plurality of solar cell assemblies of claim 31, wherein solar cell assemblies in said plurality of solar assemblies have an angle of inclination with respect to the horizontal that is about 30 degrees.

* * * * *